(12) United States Patent
Moran et al.

(10) Patent No.: US 12,148,361 B2
(45) Date of Patent: Nov. 19, 2024

(54) VEHICULAR SPARSE LED ARRAY

(71) Applicant: Lumileds LLC, San Jose, CA (US)

(72) Inventors: Brendan Jude Moran, San Jose, CA (US); Johannes Willem Herman Sillevis Smitt, San Jose, CA (US); Dirk P. J. Vanderhaeghen, Wilrijk (BE)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 18/210,070

(22) Filed: Jun. 14, 2023

(65) Prior Publication Data

US 2023/0410726 A1    Dec. 21, 2023

Related U.S. Application Data

(60) Provisional application No. 63/420,872, filed on Oct. 31, 2022, provisional application No. 63/352,517, filed on Jun. 15, 2022.

(51) Int. Cl.
*B60R 1/12* (2006.01)
*B60K 35/00* (2006.01)
(Continued)

(52) U.S. Cl.
CPC ............ *G09G 3/32* (2013.01); *B60K 35/00* (2013.01); *G06F 3/011* (2013.01); *G06F 3/0412* (2013.01);
(Continued)

(58) Field of Classification Search
CPC ........ G09G 3/32; G09G 3/035; G09G 3/2003; G09G 2300/02; G09G 2300/026;
(Continued)

(56) References Cited

U.S. PATENT DOCUMENTS

2011/0032365 A1* 2/2011 Yett ...................... H04N 13/322
359/627
2012/0242933 A1* 9/2012 Takase .................. H01L 33/647
362/249.02

(Continued)

FOREIGN PATENT DOCUMENTS

WO    2011031605    3/2011
WO    2018170352    9/2018

OTHER PUBLICATIONS

"International Application Serial No. PCT US2023 025342, International Search Report mailed Oct. 6, 2023", 7 pgs.

(Continued)

*Primary Examiner* — Abdul-Samad A Adediran
(74) *Attorney, Agent, or Firm* — Schwegman, Lundberg & Woessner, P.A.

(57) ABSTRACT

A vehicular display that contains a sparse array of light-emitting diodes (LEDs), system, and method of fabrication are disclosed. The vehicular display includes at least one tile disposed in a vehicle to provide a display of internal and external information. Each tile has a transparent flexible substrate, a sparse array of LEDs disposed on the transparent flexible substrate, a rigid substrate adhered to the transparent flexible substrate via an adhesive layer in which the sparse array of LEDs is encapsulated, and a driver disposed on an edge of the tile and configured to drive the LEDs. The LEDs are sparse enough to enable information to be displayed through a vehicle window while still enabling a viewer to see through the window.

19 Claims, 22 Drawing Sheets

(51) Int. Cl.
    *G06F 3/01*         (2006.01)
    *G06F 3/041*       (2006.01)
    *G06F 3/14*         (2006.01)
    *G09G 3/00*         (2006.01)
    *G09G 3/20*         (2006.01)
    *G09G 3/32*         (2016.01)
    *H01L 25/075*      (2006.01)
    *H01L 25/16*        (2023.01)
    *H01L 33/52*        (2010.01)
    *H04N 23/53*       (2023.01)
    *B60K 35/22*        (2024.01)

(52) U.S. Cl.
    CPC ........... *G06F 3/1446* (2013.01); *G09G 3/035* (2020.08); *G09G 3/2003* (2013.01); *H01L 25/0753* (2013.01); *H01L 25/167* (2013.01); *H01L 33/52* (2013.01); *H04N 23/53* (2023.01); *B60K 35/22* (2024.01); *B60K 2360/332* (2024.01); *G09G 2300/02* (2013.01); *G09G 2300/026* (2013.01); *G09G 2300/0426* (2013.01); *G09G 2300/0491* (2013.01); *G09G 2320/0233* (2013.01); *G09G 2320/028* (2013.01); *G09G 2320/0626* (2013.01); *G09G 2320/066* (2013.01); *G09G 2320/068* (2013.01); *G09G 2354/00* (2013.01); *G09G 2370/06* (2013.01); *G09G 2380/02* (2013.01); *G09G 2380/10* (2013.01)

(58) Field of Classification Search
    CPC ... G09G 2300/0426; G09G 2300/0491; G09G 2320/0233; G09G 2320/028; G09G 2320/0626; G09G 2320/066; G09G 2320/068; G09G 2354/00; G09G 2370/06; G09G 2380/02; G09G 2380/10; H04N 23/53; H04N 13/322; B60K 35/00; B60K 2360/332; B60K 35/22; G06F 3/011; G06F 3/0412; G06F 3/1446; H01L 25/0753; H01L 25/167; H01L 33/52; H01L 33/62; H01L 33/647; G02B 5/0236; G05D 1/0246
    USPC ...................................... 359/627; 362/249.02
    See application file for complete search history.

(56) References Cited

U.S. PATENT DOCUMENTS

| | | |
|---|---|---|
| 2015/0372051 A1 | 12/2015 | Bower et al. |
| 2017/0047393 A1 | 2/2017 | Bower et al. |
| 2019/0370564 A1* | 12/2019 | Parks .................. G05D 1/0246 |
| 2020/0066693 A1 | 2/2020 | Kim et al. |
| 2020/0365786 A1* | 11/2020 | Takeya .................. H01L 33/62 |
| 2023/0027123 A1* | 1/2023 | Lee ...................... G02B 5/0236 |

OTHER PUBLICATIONS

"International Application Serial No. PCT US2023 025342, Written Opinion mailed Oct. 6, 2023", 4 pgs.

* cited by examiner

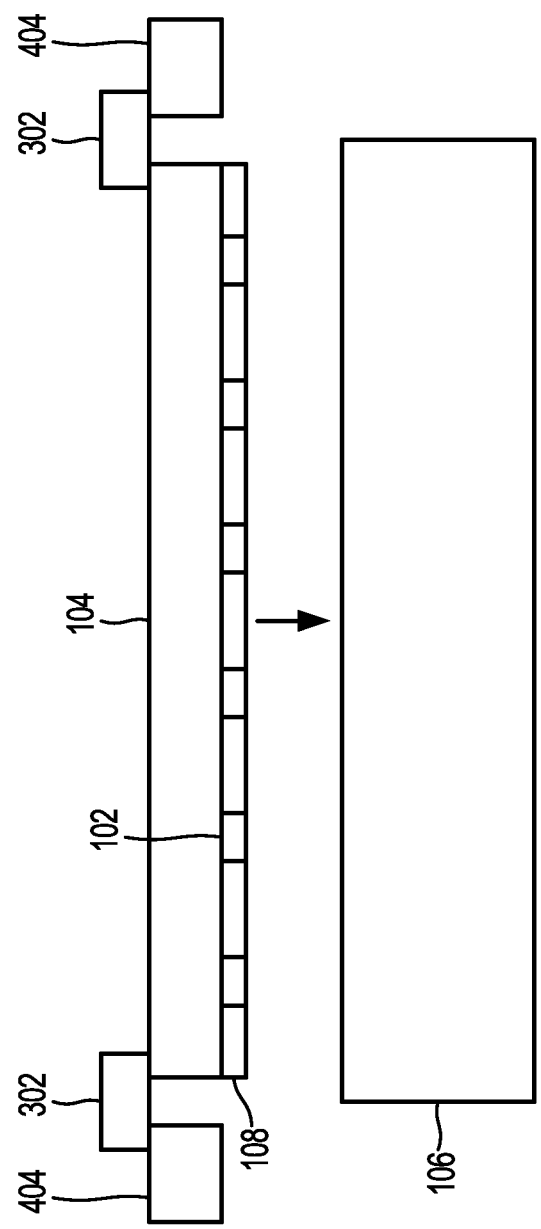

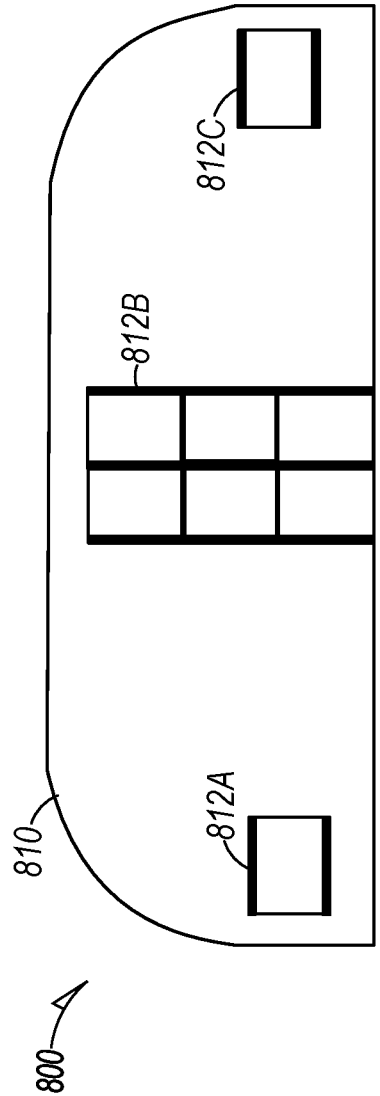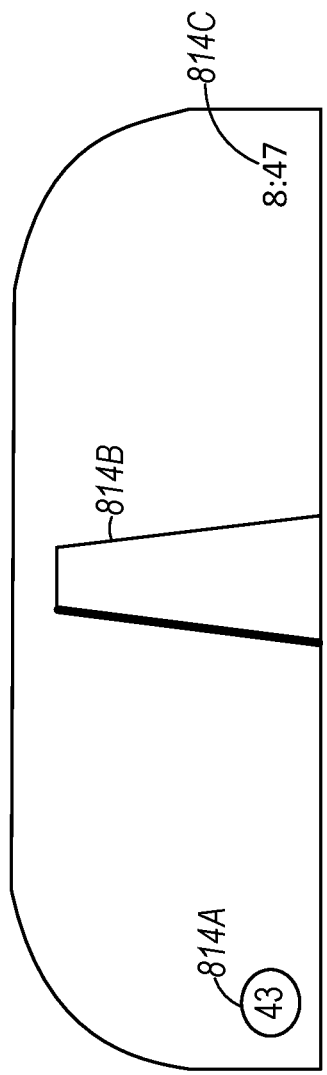

VEHICULAR SPARSE LED ARRAY

PRIORITY

This patent application claims the benefit of priority to U.S. Provisional Patent Application Ser. No. 63/352,517, filed on Jun. 15, 2022, and U.S. Provisional Patent Application 63/420,872, filed on Oct. 31, 2022, each of which is hereby incorporated by reference herein in its entirety.

FIELD OF THE DISCLOSURE

The present disclosure relates to sparse light-emitting diodes (LEDs) arrays, systems, and applications.

BACKGROUND OF THE DISCLOSURE

LEDs provide an efficient and relatively smaller source of light compared to conventional light sources. The use of LEDs has evolved from systems that provide purely lighting to more complicated systems that use lighting. Consequently, there is ongoing effort to improve technology that uses LED arrays, as well as find additional uses for LED arrays.

BRIEF DESCRIPTION OF THE DRAWINGS

FIGS. 3 and 4 show side-view drawings of the light source of FIG. 1 in various stages of assembly.

FIGS. 8A-8B show an example of a vehicular sparse array arrangement, in accordance with some examples.

Corresponding reference characters indicate corresponding parts throughout the several views. Elements in the drawings are not necessarily drawn to scale. The configurations shown in the drawings are merely examples and should not be construed as limiting in any manner.

DETAILED DESCRIPTION

For the purposes of this document, the term "micro-LED" is intended to be synonymous with an LED of a sparse array of LEDs. There is ongoing effort to improve micro-LED display technology. For example, displays, such as direct-view displays and projection displays, can use micro-LEDs to improve efficiency and increase brightness.

In a direct-view micro-LED display, the LEDs may occupy a relatively small fraction of the display area. Because most of the display area is unaffected by the LEDs, the LEDs may not substantially alter the optical properties of the surface on which they are assembled. For example, a black surface may remain black in the presence of LEDs mounted on the black surface. Similarly, a reflective surface may remain reflective in the presence of LEDs mounted on the reflective surface. Other examples and optical surface properties can also be used.

In some examples, the micro-LEDs can be assembled onto a transparent flexible substrate. The transparent flexible substrate can then be laminated onto a substrate that has desired optical properties, such as being reflective, and so forth. Using the transparent flexible substrate in this manner can allow micro-LEDs to be applied to a curved or irregularly shaped substrate, which may not be compatible with micro-LED assembly technologies that use a rigid, flat substrate, such as a wafer. Note that the terms "substantially transparent" and "transparent" are used interchangeably herein to refer to materials (such as metal oxides or very thin metals) through which light from the microLEDs passes without being substantially (more than a few percent) absorbed or reflected.

In some examples, the flexible substrate can be laminated LED-side down onto the substrate, using a transparent adhesive that has sufficient thickness to encapsulate the micro-LEDs. For these examples and others, the transparent substrate and adhesive can also function as a barrier that can protect the micro-LEDs from the environment. Because the transparent substrate can provide protection for the micro-LEDs, the transparent substrate can reduce or eliminate the need to use an additional transparent cover or protection layer to provide the protection for the micro-LEDs.

Figure 1:
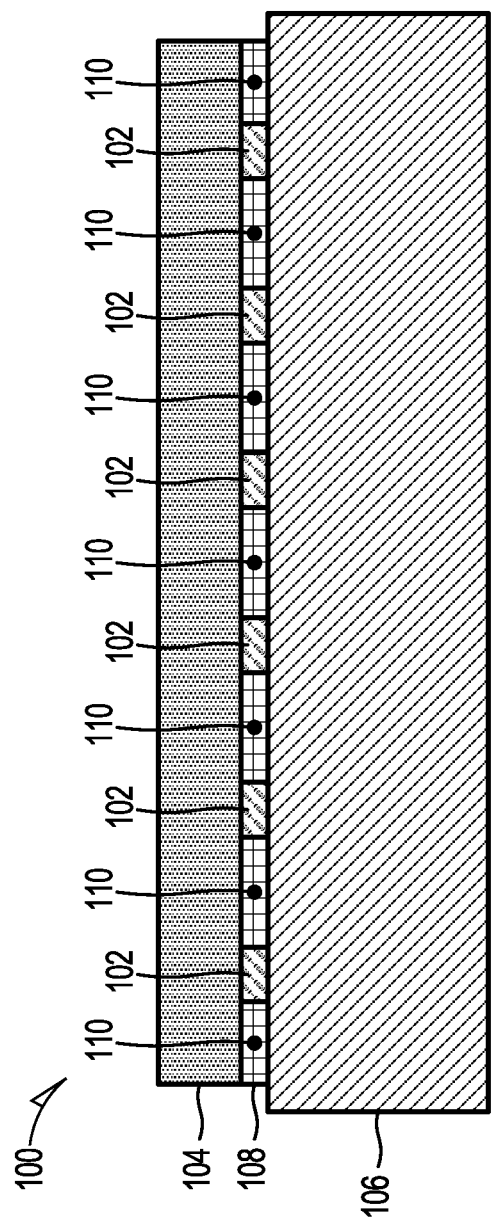
FIG. 1 shows a cross-sectional side view of an example of a light source.

FIG. 1 shows a cross-sectional side view of an example of a light source 100. The light source 100 can include a sparse array of LEDs 102 (e.g., "micro-LEDs") disposed on a transparent flexible substrate 104 and a rigid substrate 106 adhered to the transparent flexible substrate 104 with an adhesive layer 108 such that the sparse array of LEDs 102 is located between the rigid substrate 106 and the transparent flexible substrate 104. The sparse array of LEDs 102 can be encapsulated in the adhesive 110 of the adhesive layer 108.

The transparent flexible substrate 104 can be a polymer sheet with a relatively high transmittance, or, equivalently, relatively low losses due to absorption and scattering in, for example, the visible portion of the electromagnetic spectrum, such as between wavelengths of about 400 nm and about 700 nm. Suitable materials for the transparent flexible substrate 104 can include clear polyimide (PI), polyethylene naphthalate (PEN), polyethylene terephthalate (PET) and others. The transparent flexible substrate 104 can have a thickness between about 20 µm and about 200 µm, although a thickness outside this range of thicknesses can also be used.

The sparse array of LEDs 102 can be disposed on the transparent flexible substrate 104. For the purposes of this document, the term sparse is intended to signify that a light-producing surface area of the array is less, or significantly less, than a total surface area of the array. For example, a fill factor of the array (e.g., a ratio of light-producing surface area to full surface area) can be less than or equal to a specified threshold, such as 10%, 5%, 4%, 3%, 2%, 1%, or another suitable threshold. As a specific example, the LEDs 102 can be arranged in a rectangular array, with center-to-center spacing along one dimension denoted by spacing x. Each LED 102 can have a light-producing area sized along the one dimension by size s. The ratio of s divided by x can be less than or equal to 0.1. In an orthogonal dimension or substantially orthogonal direction, a similar ratio applies, with the linear size of a light-producing area being less than or equal to one-tenth the linear center-to-center spacing of the LEDs 102. Combining the two linear dimensions, the surface area of the light-producing areas of the LEDs 102 is less than or equal to 1% of the surface area of the array. In some examples, the light-producing area of each LED can be smaller than 200 µm on a side. In some examples, the light-producing area of each LED can be smaller than 50 µm on a side. Electrical traces can be deposited on the transparent flexible substrate 104 to electrically power (e.g., carry current to and from) the LEDs 102. In some examples, the electrical traces can be metal traces that are narrow enough to be invisible under typical viewing conditions. In some examples the electrical traces can be formed from one or more transparent electrically conductive materials, such as indium tin oxide (ITO).

In some examples, the sparse array of LEDs 102 can include two or more LEDs 102 that emit light at a same or similar wavelength (or color). In some examples, the sparse array of LEDs 102 can include LEDs 102 that all emit light at a same wavelength. For example, a device, such as a display, can include a sparse array of LEDs 102 that all emit red light, a sparse array of LEDs 102 that all emit green light, and a sparse array of LEDs 102 that all emit blue light. In some examples, the sparse array of LEDs 102 can include two or more LEDs 102 that emit light at different wavelengths. For example, a device, such as a display, can include a sparse array of LEDs 102 in which some LEDs 102 emit red light, some LEDs 102 emit green light, and some LEDs 102 can emit blue light. The red, green, and blue LEDs 102 can be arranged in repeating clusters, with each cluster forming a color pixel of the device. In some examples, the sparse array of LEDs 102 can include at least one LED that emits light at a visible wavelength (e.g., between about 400 nm and about 700 nm). In some examples, the sparse array of LEDs 102 can include at least one LED that emits light at an infrared wavelength (e.g., greater than about 700 nm). Such infrared wavelengths can be used for biometric sensing or other sensing techniques.

Because the sparse array of LEDs 102, including the light-emitting area of the LEDs 102, the corresponding electrical traces, and any corresponding circuitry, can have a relatively small fill factor, most of the surface area of the sparse array of LEDs 102 can be transparent. For example, light incident on the sparse array of LEDs 102, either incident from the transparent flexible substrate 104 or incident on the transparent flexible substrate 104, mostly passes through the sparse array of LEDs 102, with only a relatively small fraction being blocked by the light-emitting areas and electrical traces of the sparse array of LEDs 102.

As a result, the sparse array of LEDs 102 can produce light on a surface and/or an optical element that has an additional function, such as on the rigid substrate 106, described below. For example, the surface and/or optical element can include a reflector that has a specified value of reflectance. As another example, the surface and/or optical element can include a spectral filter that has a specified reflectance, transmittance, or absorptance at one or more specified wavelengths. Other suitable functions can also be used.

The rigid substrate 106 can be adhered to the transparent flexible substrate 104. In some examples, the rigid substrate 106 can be transparent. Suitable applications for a transparent rigid substrate 106 can include a vehicle windshield, a building window, a heads-up display, an augmented reality headset, and others. Suitable transparent materials for a transparent rigid substrate 106 can include glass, laminated glass, polycarbonate, or an engineering plastic such as poly(methyl methacrylate) (PMMA).

In some examples, the rigid substrate 106 can be reflective. In some examples, the rigid surface can be specularly reflective (e.g., can have a relatively smooth reflective surface that causes relatively little scattering or diffusion upon reflection). Suitable applications for a reflective rigid substrate 106 can include a mirror, such as a vehicular rear-view mirror or side-view mirror that can display information (e.g., a vehicular display). Specifically, the specularly reflective surface of the rigid substrate 106 can perform the function of reflecting light from the rear of the vehicle, while the sparse array of LEDs 102 can display information superimposed on the reflected light.

In some examples, the rigid substrate 106 can be protective and/or decorative, such as a case material of a mobile device, such as a smart phone. The rigid substrate 106 can include other suitable optical properties and perform other suitable functions as well.

The rigid substrate 106 can be flat (e.g., substantially flat) or curved. Curved substrates can be used in vehicle windshields, augmented reality headsets, wearables, or other suitable devices. In some examples, the rigid substrate 106 is formed as a single unitary body. In other examples, the rigid substrate 106 can include multiple rigid substrate elements. For example, multiple rigid substrate elements can be used to create a folding display in a smartphone or other mobile device. Custom tooling can support such curved substrates in the lamination process, described below.

The adhesive can adhere the rigid substrate 106 to the transparent flexible substrate 104. In some examples, the adhesive can be formed as an adhesive layer 108 such that the sparse array of LEDs 102 is located between the rigid substrate 106 and the transparent flexible substrate 104. Other suitable configurations can also be used. Suitable materials for the adhesive of the adhesive layer 108 can include silicone, epoxy silicone, an acrylic film, an epoxy film, and others.

In some examples, the adhesive of the adhesive layer 108 can be formed from a material having a refractive index that can match or substantially match a refractive index of the transparent flexible substrate 104 and/or the rigid substrate 106 or can fall between refractive indices of the transparent flexible substrate 104 and the rigid substrate 106. Selecting a refractive index in this manner can reduce or eliminate reflections at the interface between the adhesive layer 108 and the transparent flexible substrate 104 and/or at the interface between the adhesive layer 108 and the rigid substrate 106. For example, the adhesive of the adhesive layer 108 can be formed from a material having a refractive index between about 1.4 and about 1.7. Using a refractive index in the range of about 1.4 to about 1.7 can reduce unwanted reflections between the adhesive layer 108 and the transparent flexible substrate 104 and unwanted reflections between the adhesive layer 108 and the rigid substrate 106. Optional thin-film anti-reflection coatings can also be used to help reduce or eliminate unwanted reflections at one or more interfaces between adjacent differing materials or between a material and air.

In some examples, the adhesive layer 108 can fully encapsulate the sparse array of LEDs 102. By fully encapsulating the sparse array of LEDs 102, the adhesive layer 108 can protect the sparse array of LEDs 102 from the environment and can form a smooth, unbroken interface with the rigid substrate 106. To fully encapsulate the sparse array of LEDs 102, the adhesive of the adhesive layer 108 can have a resin viscosity that is low enough such that the adhesive flows around the LEDs 102 as the adhesive is deposited. In addition, to fully encapsulate the sparse array of LEDs 102, the adhesive layer 108 can be thick enough to fully cover the topography of the sparse array of LEDs 102.

Figure 2:
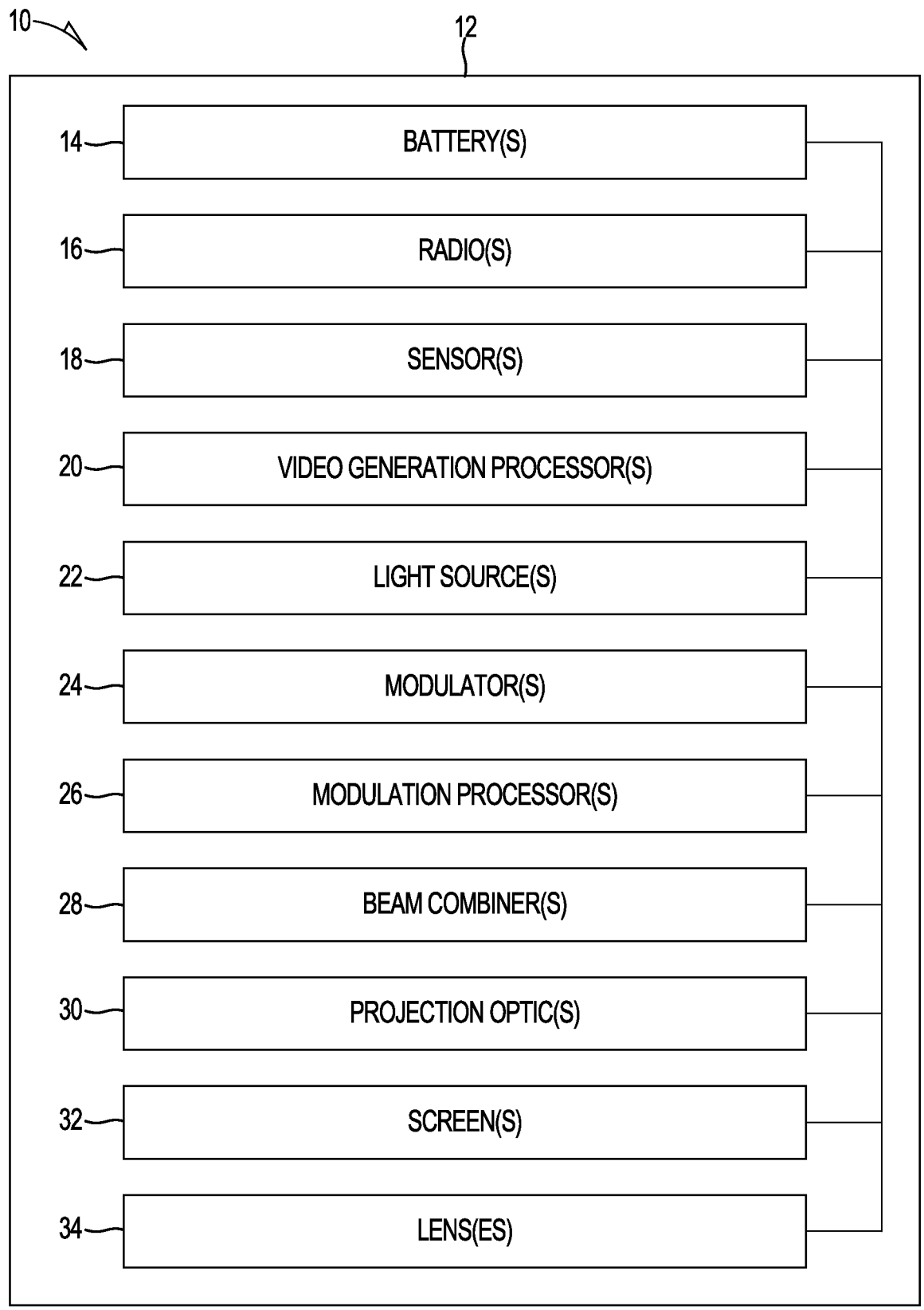
FIG. 2 shows a block diagram of an example of a visualization system, which can include the light source of FIG. 1.

FIG. 2 shows a block diagram of an example of a visualization system 10, which can include the light source 100 of FIG. 1. The visualization system 10 can include a wearable housing 12, such as a headset or goggles. The housing 12 can mechanically support and house the elements detailed below. In some examples, one or more of the elements detailed below can be included in one or more additional housings that can be separate from the wearable housing 12 and couplable to the wearable housing 12 wirelessly and/or via a wired connection. For example, a separate housing can reduce the weight of wearable goggles, such as by including batteries, radios, and other elements. The housing 12 can include one or more batteries 14, which can electrically power any or all of the elements detailed below. The housing 12 can include circuitry that can electrically couple to an external power supply, such as a wall outlet, to recharge the batteries 14. The housing 12 can include one or more radios 16 to communicate wirelessly with a server or network via a suitable protocol, such as WiFi.

The visualization system 10 can include one or more sensors 18, such as optical sensors, audio sensors, tactile sensors, thermal sensors, gyroscopic sensors, time-of-flight sensors, triangulation-based sensors, and others. In some examples, one or more of the sensors can sense a location, a position, and/or an orientation of a user. In some examples, one or more of the sensors 18 can produce a sensor signal in response to the sensed location, position, and/or orientation. The sensor signal can include sensor data that corresponds to a sensed location, position, and/or orientation. For example, the sensor data can include a depth map of the surroundings. In some examples, such as for an augmented reality system, one or more of the sensors 18 can capture a real-time video image of the surroundings proximate a user.

The visualization system 10 can include one or more video generation processors 20. The one or more video generation processors 20 may receive, from a server and/or a storage medium, scene data that represents a three-dimensional scene, such as a set of position coordinates for objects in the scene or a depth map of the scene. The one or more video generation processors 20 can receive one or more sensor signals from the one or more sensors 18. In response to the scene data, which represents the surroundings, and at least one sensor signal, which represents the location and/or orientation of the user with respect to the surroundings, the one or more video generation processors 20 can generate at least one video signal that corresponds to a view of the scene. In some examples, the one or more video generation processors 20 can generate two video signals, one for each eye of the user, which represent a view of the scene from a point of view of the left eye and the right eye of the user, respectively. In some examples, the one or more video generation processors 20 can generate more than two video signals and combine the video signals to provide one video signal for both eyes, two video signals for the two eyes, or other combinations.

The visualization system 10 can include one or more light sources 22 (such as the light source 100 of FIG. 1) that can provide light for a display of the visualization system 10. Suitable light sources 22 can include a light-emitting diode, a monolithic light-emitting diode, a plurality of light-emitting diodes, an array of light-emitting diodes, an array of light-emitting diodes disposed on a common substrate, a segmented light-emitting diode that is disposed on a single substrate and has light-emitting diode elements that are individually addressable and controllable (and/or controllable in groups and/or subsets), an array of micro-light-emitting diodes (microLEDs), and others. In some examples, one or more of the light sources 22 can include a sparse array of LEDs disposed on a transparent flexible substrate, and a rigid substrate adhered to the transparent flexible substrate with an adhesive layer such that the sparse array of LEDs is located between the rigid substrate and the transparent flexible substrate.

A light-emitting diode can be white-light light-emitting diode. For example, a white-light light-emitting diode can emit excitation light, such as blue light or violet light. The white-light light-emitting diode can include one or more phosphors that can absorb some or all of the excitation light and can, in response, emit phosphor light, such as yellow light, which has a wavelength greater than a wavelength of the excitation light.

The one or more light sources 22 can include light-producing elements having different colors or wavelengths. For example, a light source can include a red light-emitting diode that can emit red light, a green light-emitting diode that can emit green light, and a blue light-emitting diode that can emit blue right. The red, green, and blue light combine in specified ratios to produce any suitable color that is visually perceptible in a visible portion of the electromagnetic spectrum.

The visualization system 10 can include one or more modulators 24. The modulators 24 can be implemented in one of at least two configurations.

In a first configuration, the modulators 24 can include circuitry that can modulate the light sources 22 directly. For example, the light sources 22 can include an array of light-emitting diodes, and the modulators 24 can directly modulate the electrical power, electrical voltage, and/or electrical current directed to each light-emitting diode in the array to form modulated light. The modulation can be performed in an analog manner and/or a digital manner. In some examples, the light sources 22 can include an array of red light-emitting diodes, an array of green light-emitting diodes, and an array of blue light-emitting diodes, and the modulators 24 can directly modulate the red light-emitting diodes, the green light-emitting diodes, and the blue light-emitting diodes to form the modulated light to produce a specified image.

In a second configuration, the modulators 24 can include a modulation panel, such as a liquid crystal panel. The light sources 22 can produce uniform illumination, or nearly uniform illumination, to illuminate the modulation panel. The modulation panel can include pixels. Each pixel can selectively attenuate a respective portion of the modulation panel area in response to an electrical modulation signal to form the modulated light. In some examples, the modulators 24 can include multiple modulation panels that can modulate different colors of light. For example, the modulators 24 can include a red modulation panel that can attenuate red light from a red light source such as a red light-emitting diode, a green modulation panel that can attenuate green light from a green light source such as a green light-emitting diode, and a blue modulation panel that can attenuate blue light from a blue light source such as a blue light-emitting diode.

In some examples of the second configuration, the modulators 24 can receive uniform white light or nearly uniform white light from a white light source, such as a white-light light-emitting diode. The modulation panel can include wavelength-selective filters on each pixel of the modulation panel. The panel pixels can be arranged in groups (such as groups of three or four), where each group can form a pixel of a color image. For example, each group can include a panel pixel with a red color filter, a panel pixel with a green color filter, and a panel pixel with a blue color filter. Other suitable configurations can also be used.

The visualization system 10 can include one or more modulation processors 26, which can receive a video signal, such as from the one or more video generation processors 20, and, in response, can produce an electrical modulation signal. For configurations in which the modulators 24 directly modulate the light sources 22, the electrical modulation signal can drive the light sources 24. For configurations in which the modulators 24 include a modulation panel, the electrical modulation signal can drive the modulation panel.

The visualization system 10 can include one or more beam combiners 28 (also known as beam splitters 28), which can combine light beams of different colors to form a single multi-color beam. For configurations in which the light sources 22 can include multiple light-emitting diodes of different colors, the visualization system 10 can include one or more wavelength-sensitive (e.g., dichroic) beam splitters 28 that can combine the light of different colors to form a single multi-color beam.

The visualization system 10 can direct the modulated light toward the eyes of the viewer in one of at least two configurations. In a first configuration, the visualization system 10 can function as a projector, and can include suitable projection optics 30 that can project the modulated light onto one or more screens 32. The screens 32 can be located a suitable distance from an eye of the user. The visualization system 10 can optionally include one or more lenses 34 that can locate a virtual image of a screen 32 at a suitable distance from the eye, such as a close-focus distance, such as 500 mm, 750 mm, or another suitable distance. In some examples, the visualization system 10 can include a single screen 32, such that the modulated light can be directed toward both eyes of the user. In some examples, the visualization system 10 can include two screens 32, such that the modulated light from each screen 32 can be directed toward a respective eye of the user. In some examples, the visualization system 10 can include more than two screens 32. In a second configuration, the visualization system 10 can direct the modulated light directly into one or both eyes of a viewer. For example, the projection optics 30 can form an image on a retina of an eye of the user, or an image on each retina of the two eyes of the user.

For some configurations of augmented reality systems, the visualization system 10 can include an at least partially transparent display, such that a user can view the user's surroundings through the display. For such configurations, the augmented reality system can produce modulated light that corresponds to the augmentation of the surroundings, rather than the surroundings itself. For example, in the example of a retailer showing a chair, the augmented reality system can direct modulated light, corresponding to the chair but not the rest of the room, toward a screen or toward an eye of a user.

Figure 3:
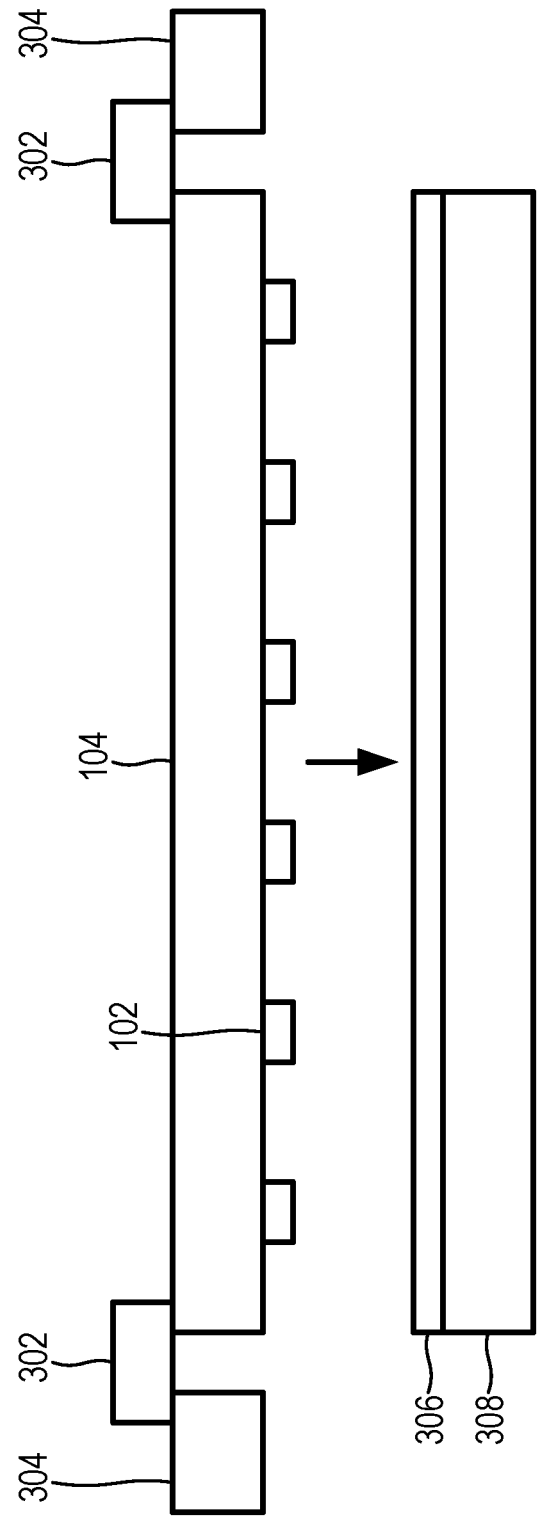

FIGS. 3 and 4 show side-view drawings of the light source 100 of FIG. 1 in various stages of assembly. Assembling the light source 100 in this manner can help avoid air occlusions, which can degrade the appearance and optical performance of the finished device. Other assembly techniques can also be used.

In FIG. 3, a sparse array of LEDs 102 has been disposed (e.g., mounted, grown, deposited, or otherwise formed) on the transparent flexible substrate 104. The transparent flexible substrate 104 has been removably mounted in or on a frame 302. Lamination tooling 304 can advance the frame 302 toward an adhesive layer 306 that has been deposited on a support film 308. Alternatively, the lamination tooling 304 can advance the adhesive layer 306 toward the frame 302, or advance both toward each other. The sparse array of LEDs 102 will contact the adhesive layer 306, which has been deposited on the support film 308. The adhesive of the adhesive layer 306 can be in solid form at room temperature. The adhesive has been coated on the support film 308 and has been covered by a cover film (not shown). A vacuum laminator with a temperature range that allows the adhesive to flow and conformally cover the LED array topography can laminate the adhesive layer 306 onto the sparse array of LEDs 102 to encapsulate the sparse array of LEDs 102 in the adhesive layer 108. After lamination, the support film 308 can then be removed.

In FIG. 4, the lamination tooling 404 (optionally the same lamination tooling 304 as in FIG. 3) can advance the transparent flexible substrate 104 and the adhesive layer 108, with the sparse array of LEDs 102 encapsulated in the adhesive layer 108, toward the rigid substrate 106. Alternatively, the lamination tooling 404 can advance the rigid substrate 106 toward the transparent flexible substrate 104 and the adhesive layer 108, or advance both toward each other. The lamination tooling can laminate the adhesive layer 108, with the sparse array of LEDs 102 encapsulated in the adhesive layer 108, onto the rigid substrate 106. After the adhesive layer 108 has been laminated onto the rigid substrate 106, the full layered structure can be subjected to a temperature cycle (the temperature range being selected for the adhesive layer 108 used), exposure to ultraviolet light, or other suitable curing technique to cure the adhesive.

In the examples described above, the transparent flexible substrate 104 has been laminated with the LED side facing the rigid substrate 106, such that the LEDs 102 are located between the two substrates and encapsulated by the adhesive. Alternatively, the transparent flexible substrate 104 can be laminated with the LED side facing away from the rigid substrate 106, such that the LEDs 102 are exposed, and the transparent flexible substrate 104 is located between the exposed LEDs 102 and the rigid substrate 106.

In some examples, additional components can be assembled onto the transparent flexible substrate, such as integrated circuits (ICs), micro-ICs, or transistors for display backplanes. Moreover, additional layers may be integrated into a device to form a capacitive or resistive touchscreen.

In some embodiments, an LED includes multiple semiconductor layers grown on a substrate (e.g., a sapphire substrate) that are to be fabricated into pixels. The substrate may be any substrate, such as sapphire, capable of having epitaxial layers grown thereon. The substrate may have patterns on which the epitaxial layers are grown. The pixels may be formed from gallium nitride (GaN), having an n-type semiconductor adjacent to the substrate, a p-type semiconductor, and an active region between the n-type semiconductor and the p-type semiconductor. The active region may be, for example, a multiple quantum well structure in which light is generated for emission from the pixels. After processing, the substrate may be removed in some embodiments.

Before etching of the epitaxial GaN layers, die layers of chip-scale packages (CSP) allowing uniform current distribution and optical coupling may be deposited or otherwise formed. For example, uniform current injection in the p-type semiconductor may be obtained by depositing a transparent conductive oxide (TCO) layer such as indium tin oxide (ITO), indium zinc oxide (IZO), zinc oxide (ZnO), or tin oxide (SnO) on the p-type semiconductor.

Figure 5A:
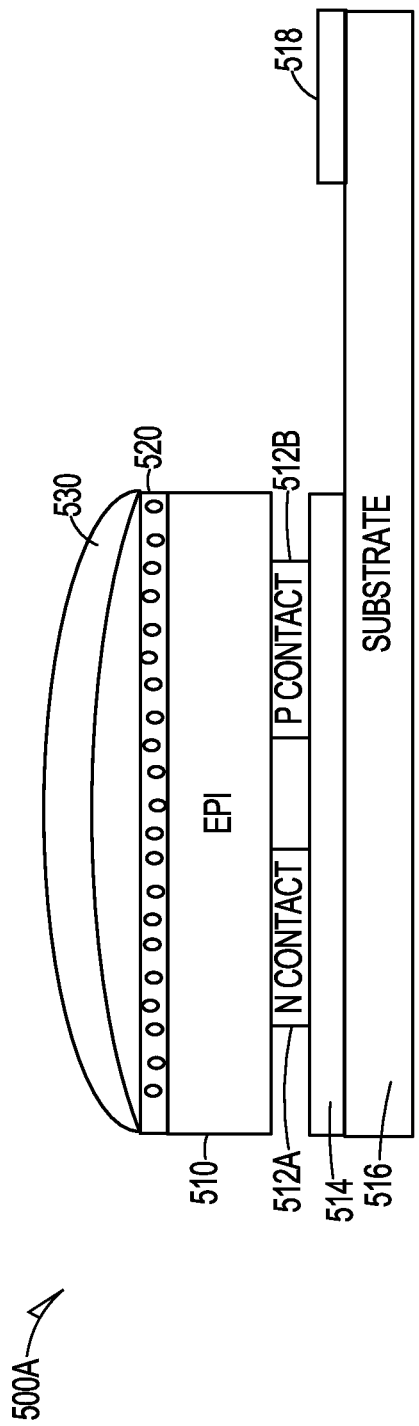
FIG. 5A illustrates a cross-sectional view of an LED of the sparse array, in accordance with some examples.

FIG. 5A illustrates a cross-sectional view of an LED 500a of the sparse array, in accordance with some examples. The LED 500a may contain an epitaxial stack 510 of n-type and p-type semiconductors (e.g., GaN, InGaN, AlInGaP, GaAs, InGaAs). The thickness of the epitaxial stack 510 may range from about 3 µm to about 15 µm, typically about 5 µm, although a person of ordinary skill in the art, upon reading and understanding the disclosed subject matter, will recognize that other thickness ranges may be used. The n-type semiconductor and p-type semiconductor of the epitaxial stack 510 may make electrical contact to traces 514 on a substrate 516 via an n-contact 512a and a p-contact 512b, respectively. The n-contact 512a and p-contact 512b (or interconnect material) may be formed from a metal or compound such as Au, Sn, AuSn, In, Anisotropic conductive film (ACF)/ACInk, SnAgCu (SAC). The thickness of the contact 512a and p-contact 512b may range, for example, from about 0.02 µm to about 5 µm, typically about 0.1 µm. The traces 514 may be formed from a TCO material. The thickness of the traces 514 may range from about 0.5 µm to about 10 µm, typically about 1 µm. The n-contact 512a and p-contact 512b may be patterned and formed from a metal, such as copper (Cu), nickel (Ni), gold (Au), silver (Ag), and/or titanium (Ti), for example, which may be deposited on the epitaxial stack 510. The substrate 516 may be the rigid or flexible substrate described above formed, for example, from glass, Polyethylene Terephthalate (PET), or clear polyimide. The thickness of the substrate 516 may range from, for example, about 50 µm to about 1000 µm, typically about 100 µm. Metallic conductors 518 may make contact to the traces 514 to route power and other signals to the epitaxial stack 510. The metallic conductors 518 may be formed from a metal or compound such as Au, Cu, Al, Ti, Ni, or Mo. The thickness of the metallic conductors 518 may range from about 0.5 µm to about 30 µm, typically about 1 µm.

In some embodiments, a light-converting layer 520 containing phosphor particles may be disposed on or adjacent to the epitaxial stack 510. The light-converting layer 520 may convert the light emitted by the epitaxial stack 510 to white light, for example.

A lens 530 and/or other optical elements may be disposed over the epitaxial stack 510 as shown. The lens 530 and/or other optical elements may be incorporated in the adhesive layer. Although not shown, the other substrate may be disposed on the lens 530.

Figure 5B:
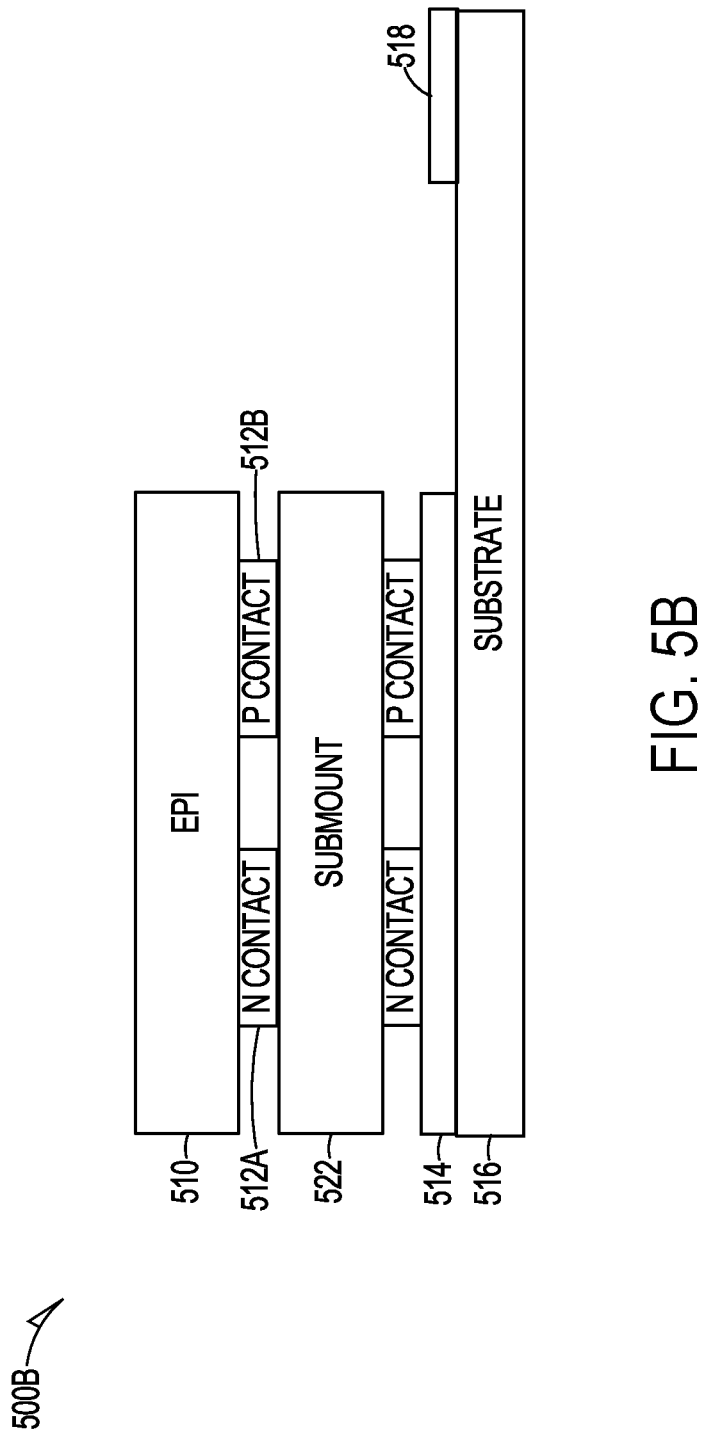
FIG. 5B illustrates a cross-sectional view of an LED of another sparse array, in accordance with some examples.

FIG. 5B illustrates a cross-sectional view of an LED 500b of another sparse array, in accordance with some examples. As indicated, the difference between the LED 500b of FIG. 5B and the LED 500a of FIG. 5A is the presence of a submount 522 (the optional light-converting layer 520 and lens 530 are not shown in FIG. 5B for convenience). The submount 522 may be a rigid substrate formed, for example, from glass or silicon. The thickness of the submount 522 may range from, for example, about 5 µm to about 100 µm, typically about 20 µm. The interconnect material may be the same on both sides of the submount 522.

In some embodiments, vertical singulated LEDs may have a smallest x-y dimensions of, for example, about 3 µm×about 3 µm and a largest x-y dimensions of about, for example, 15 µm×about 15 µm. Lateral and flip chip LEDs may have a smallest x-y dimensions of about 3 µm×about 6 µm and a largest x-y dimensions of about 50 µm×about 75 µm. In this case, a 127 µm×127 µm panel having a 200 pixels per inch (PPI) with a 40×40 µm microIC, 25×25 µm LED submount, 2×10 µm×127 µm traces to supply the microIC, 2×10 µm×<50 µm traces to supply LEDs, the total opaque or semi-opaque area of the tile is 5765 µm², the total area per pixel in 200 ppi is 16129 µm², and the fractional area is 35% covered, 65% transparent. Similarly, a 362 µm×362 µm panel having a 70 pixels per inch (PPI) with a 40 µm×40 µm microIC, 25×25 µm LED submount, 2×10 µm×362 µm traces to supply the microIC, 2×10 µm×<150 µm traces to supply LEDs, the total opaque or semi-opaque area of the tile is 12465 µm², the total area per pixel in 70 ppi is 131044 µm², and the fractional area is 10% covered, 90% transparent. Either of these may provide panels with sufficient transparency to see through the panel.

Figure 6:
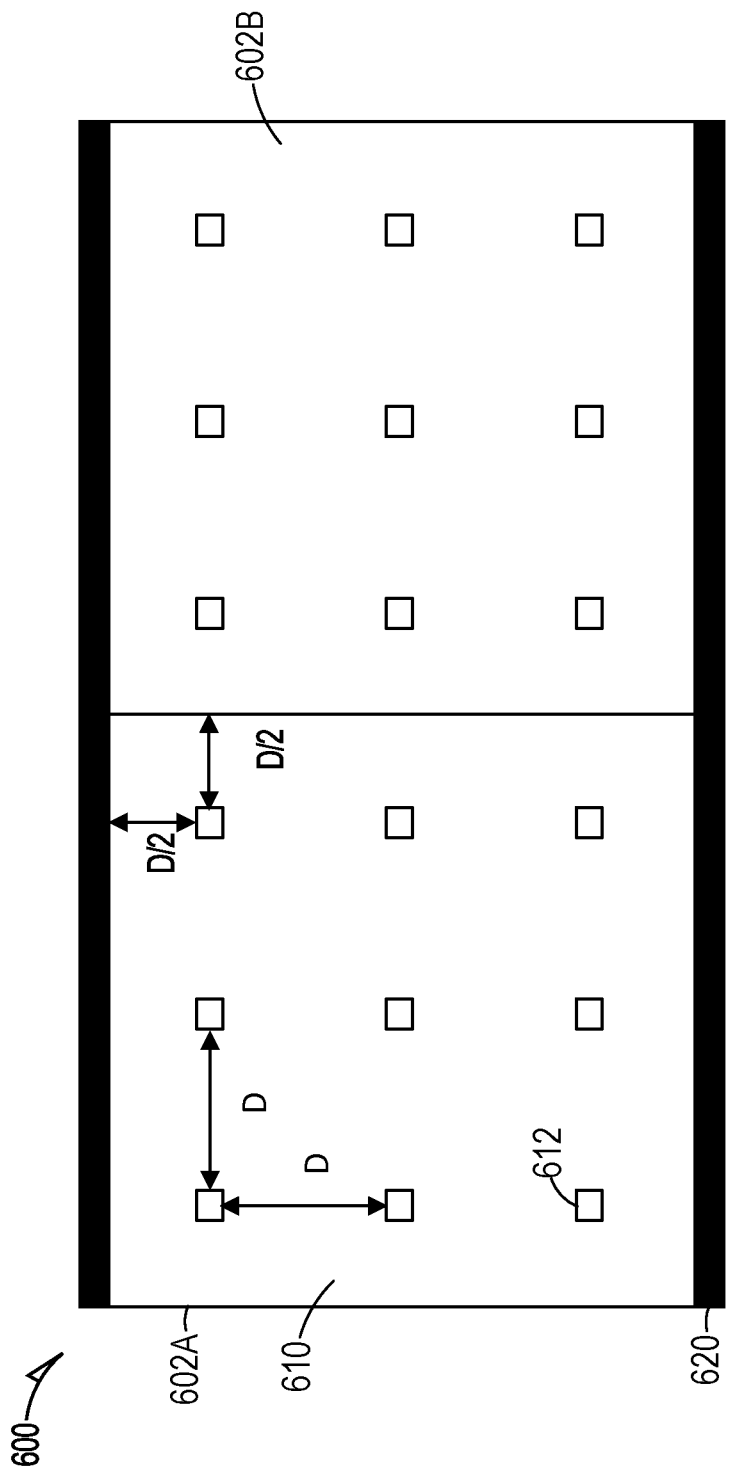
FIG. 6 shows a top view of an example of a panel in accordance with various embodiments of the disclosed subject-matter.

FIG. 6 shows a top view of an example of a panel in accordance with various embodiments of the disclosed subject-matter. The panel 600 contains multiple adjacent (touching) tiles 602a, 602b. Each tile 602a, 602b contains an LED array 610. Each LED array 610 contains multiple LEDs 612 arranged in a sparse distribution, similar to that described above. Each LED 612 may emit light of the same color or may emit different light of different colors. The electrical connections between the LEDs 612 and from LEDs 612 to other (external) components such as a driver are not shown for convenience. Multiple LEDs 612 of different colors may be arranged at each individual (pixel) location of the LEDs 612.

As shown, the panel 600 may be formed from adjacent LED arrays 610 (tiles 602a, 602b). In some embodiments, each LED array 610 may be of the same size and may have the same number of LEDs 612. The LEDs 612 within each LED array 610 may be separated by a uniform distance D in both orthogonal (x-y) directions. Each LED 612 closest to the edge in each LED array 610 is disposed is disposed at half the uniform distance D/2 from the edge of the LED array 610.

Although the LEDs 612 are shown in FIG. 6 as being disposed in a square LED array 610 (i.e., the number of LEDs 612 are the same in each orthogonal direction) any shaped LED array (e.g., rectangular, triangular) may be used in the panel 600 so long as the LED arrays are able to fit together to be in contact on all sides with another LED array and the spacing between the LEDs 612 remains constant. Drivers and other control circuitry may be disposed at one electronics edge 620 or opposing edges of each tile 602a, 602b. The electronics edge 620 may be orthogonal to a common edge between the tiles 602a, 602b. The electronics edge 620 may contain multiple drivers that are each configured to drive one or more microLEDs in each pixel.

Thus, a display formed by the panel 600 may essentially be edgeless. That is, at most three sides may be free from any visible power conductors or signal busses. Such a display may be formed from multiple tiles 602a, 602b having essentially identical characteristics and uniform distance between pixels (LEDs) to form a larger display.

Although not shown, in some embodiments every panel or tile may contain one or more control components. The control components may include one or more sensors to detect users in proximity of the panel or tile and/or provide feedback to the processor. In addition, the panel or tile may include other sensors, such as touch sensors, to allow the panel or tile to be used as a user input device in addition to merely displaying information. In this case, the panel or tile may, for example, display an alphanumeric pad using the panel or tile on a side window that contains the sparse LED array (which display may be initiated based on a proximity sensor in the panel detecting the presence of a user) and detect a combination supplied by a user to unlock a particular door(s). The panel or tile may also include one or more connectors to external digital signals, conductors and interfaces for power supply to the panel or tile, as well as other control circuitry. Integrated circuits that supply current to LEDs for one or more pixels may be included for every nth pixel. In addition, every pixel may include multiple LEDs of different colors (e.g., red, green, and blue LEDs), in addition to conductors for power and digital signals to enable delivery of a predetermined current to the LEDs.

Figure 7:
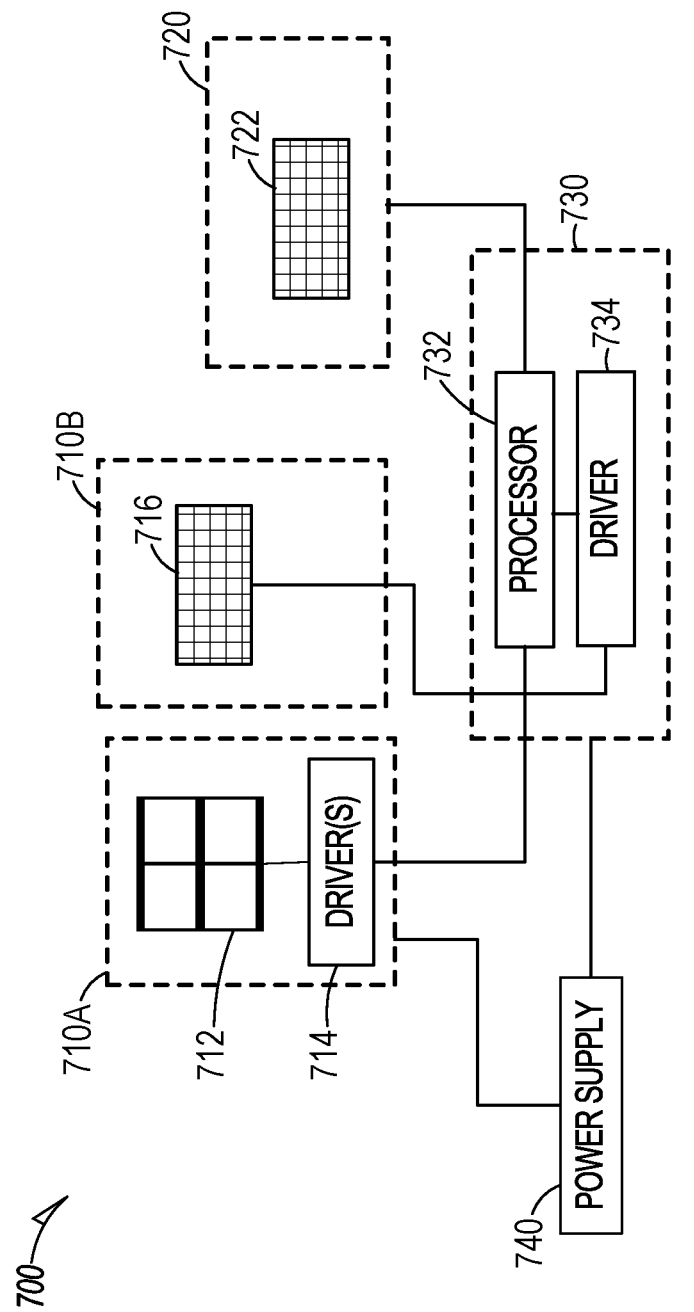
FIG. 7 shows an example of a vehicle system, in accordance with some examples.

FIG. 7 shows an example of a vehicle system 700, in accordance with some examples. In some embodiments, other components may be present, while in other embodiments not all of the components may be present. As indicated herein, although the term "a" is used herein, one or more of the associated elements may be used in different embodiments. For example, the term "a processor" configured to carry out specific operations includes both a single processor configured to carry out all of the operations as well as multiple processors individually configured to carry out some or all of the operations (which may overlap) such that the combination of processors carry out all of the operations.

The vehicle system 700 may include one or more light sources 710a, 710b. A first light source 710a may include one or more of the sparse LED arrays 712 as described herein. The first light source 710a may include local drivers 714, as also described herein. The first light source 710a may be disposed in various locations on or within a vehicle, as described in more detail herein. A second light source 710b may include one or more non-sparse LED arrays 716 (e.g., microLED arrays, miniLEDs arrays, or other). The second light source 710b may be disposed in various locations on or within a vehicle, such as head lights, taillights, or locations for accent lighting or internal cabin lighting, among others.

A microLED array contains thousands to millions of microscopic microLEDs that emit light and that may be individually controlled or controlled in groups of pixels (e.g., 5×5 groups of pixels). The microLEDs are small (e.g., <0.07 mm on a side) and may provide monochromatic or multi-chromatic light, typically red, green, blue, or yellow using inorganic semiconductor material such as that indicated above. Other LEDs may have a size, for example, of about 4 $mm^2$, 250 micron×250 micron, or larger. MicroLEDs may be used due to their thickness about a 5 μm thickness or so, similar to thin film LEDs, and, as there is no substrate inherent to microLEDs, microLEDs may be able to be placed directly on a backplane. This results in a light source that has an overall thickness that is substantially less than that using other LEDs and permits the use of the MicroLEDs in the structures described herein. The individual control provided by the microLEDs allows the driving electronics for displays to use either an active matrix array of driving transistors or a full driver microICs individual intensity control. The use of microICs may be used to bring a substantial amount of fine control to each LED operation.

A controller 730 may include a processor 732, which may be used to control various functions of the vehicle system 700. As also shown, the controller 730 may contain further components, such as a driver 734 configured to drive, among others, the second light source 710b as controlled by the processor 732. In some embodiments, the driver 734 may also be configured to provide non-local driving of the sparse LED arrays 712 of the first light source 710a.

As above, LEDs of the sparse LED arrays 712 and non-sparse LED arrays 716 may be formed from one or more inorganic materials (e.g., binary compounds such as gallium arsenide (GaAs), ternary compounds such as aluminum gallium arsenide (AlGaAs), quaternary compounds such as indium gallium phosphide (InGaAsP), gallium nitride (GaN), or other suitable materials), usually either III-V materials (defined by columns of the Periodic Table) or II-VI materials. The LEDs in the different arrays may emit light in the visible spectrum (about 400 nm to about 800 nm) and/or may emit light in the infrared spectrum (above about 800 nm). At least some of the LEDs may be formed by combining n- and p-type semiconductors on a rigid substrate (which may be textured), for example, of sapphire aluminum oxide (Al2O3) or silicon carbide (SiC), among others. In particular, various layers are deposited and processed on the substrate during fabrication of the LEDs. The surface of the substrate may be pretreated to anneal, etch, polish, etc. the surface prior to deposition of the various layers. The original substrate may be removed and replaced by a thin transparent rigid substrate, such as glass, or a flexible substrate, for example plastic.

In general, the various LED layers may be fabricated using epitaxial semiconductor deposition (e.g., by metal organic chemical vapor deposition) to deposit one or more semiconductor layers, metal deposition (e.g., by sputtering), oxide growth, as well as etching, liftoff, and cleaning, among other operations. The substrate may be removed from the LED structure after fabrication and after connection to contacts on a backplane via metal bonding such as via wire or ball bonding. The backplane may be a printed circuit board or wafer containing integrated circuits (ICs), such as a CMOS IC wafer or from a transparent material such as glass, PET, polyamideimide, polyetherimide, or clear polyimide. The semiconductor deposition operations may be used to create an LED with an active region in which electron-hole recombination occurs and the light from the LED is generated. The active region may be, for example, one or more quantum wells. Metal contacts may be used to drive provide current to the n- and p-type semiconductors from the ICs (such as drivers) of the backplane on which the LED is disposed. Methods of depositing materials, layers, and thin films may include, for example: sputter deposition, atomic layer deposition (ALD), chemical vapor deposition (CVD), physical vapor deposition (PVD), plasma enhanced atomic layer deposition (PEALD), plasma enhanced chemical vapor deposition (PECVD), and combinations thereof, among others.

In some embodiments, one or more other layers, such as a phosphor-converting layer that contains phosphor particles, may be disposed on some or all of the LEDs or some or all of the LED arrays 712,716 to convert at least a portion of the light from the LEDs to light of a different wavelength. For example, blue light from GaN LEDs may be converted into near infrared light or white light by the phosphor-converting layer.

The light sources 710a, 710b may include at least one lens and/or other optical elements such as reflectors. In different embodiments, a single lens may be disposed over one or more of the LED arrays 712,716, multiple lenses may be disposed over one or more of the LED arrays 712,716 with a single lens disposed over one or more of the LED arrays 712,716, or multiple lenses may be disposed over one or more of the LED arrays 712,716 with a single lens disposed over one or more of the LEDs of each of the LED arrays 712,716. The at least one lens and/or other optical elements may direct the light emitted by the one or more of the LED arrays 712,716 toward a target.

The processor 732 may also control a sensor 720 that includes a multi-pixel detector 722. The sensor 720 may sense light at the wavelength or wavelengths emitted by the second LED array 716 and reflected by a target and/or radiation that is emitted by the target. The sensor 720 may, for example, be a radar or lidar sensor, or the processor 732 may be used to determine the presence of specific objects (e.g., other vehicles, people, road signs) nearby. The sensor 720 may include optical elements (e.g., at least one sensor lens) to capture the radiation. The multi-pixel detector 722 may include, for example, photodiodes or one or more other detectors capable of detecting light in the wavelength range (s) of interest.

The multi-pixel detector 722 may include multiple different arrays to sense visible and/or infrared light. The multi-pixel detector 722 may have one or more segments (that are able to sense the same wavelength/range of wavelengths or different wavelength/range of wavelengths), similar to the LED.

In some embodiments, instead of, or in addition to, being provided in the sensor 720, a multi-pixel detector may be provided in the second light source 710b. In some embodiments, the second light source 710b and the sensor 720 may be integrated in a single module, while in other embodiments, the second light source 710b and the sensor 720 may be separate modules that are disposed on a printed circuit board (PCB) or other mount. In other embodiments, the second light source 710b and the sensor 720 may be attached to different PCBs or mounts.

The LEDs may be driven in an analog or digital manner, i.e., using a direct current (DC) driver or pulse width modulation (PWM). As shown, drivers 714, 734 may be used to respectively drive the LEDs in the LED array 712, 716, as well as other components, such as the actuators.

The components of the vehicle system 700 shown in FIG. 7 may be provided power using a power supply 740, such as the vehicle battery.

The first light source 710a may be arranged to emit light in sparse distribution such that the LEDs occupy a small areal density so as to enable visual observation of information provided by the first light source 710a while permitting viewing through the underlying transparent (flexible) substrate of the regions between the LEDs along a line of sight that passes through the regions between the LEDs. This may allow an observer on the emitting side of the first light source 710a to view the information projected by first light source 710a as well as the underlying scene. In other embodiments in which the underlying substrate is fully reflective to visible light or specularly reflective, the regions between the LEDs may not be viewable.

The information projected by first light source 710a may be static or moving similar to that able to be formed from a non-sparse electronic. The LEDs of the first light source 710a may be electrically connected using conductive traces on the substrate that are configured to provide drive current to the LEDs from the drivers 714. The conductive traces may include one or more TCO. The conductive traces, even if formed from a non-transparent metal, may be relatively narrow and spaced sufficiently far apart to permit visual observation through the substrate without substantial interference. The conductive traces may, for example, be less than about 100 μm wide. The LEDs may be connected in series or parallel via the conductive traces along each of a row and column to the edge or edges containing the control circuitry (and power supply) and may be addressed individually or in groups of LEDs.

The first light source 710a can be mounted on or in, or attached to, any portion of a vehicle. FIGS. 8A-8B show an example of a vehicular sparse array arrangement 800, in accordance with some examples. For example, as shown in the vehicular sparse array arrangement 800 of FIG. 8A, a sparse light source 812a, 812b, 812c described above may be disposed within or on one or more sections of a front window 810 of a vehicle. The sparse light sources 812a, 812b, 812c may be controlled by a processor within the vehicle, which may be used to control other systems of the vehicle or may be a dedicated processor configured to control display by the sparse light sources 812a, 812b, 812c. The sparse light sources 812a, 812b, 812c may be of the same size and shape or of different sizes and/or shapes.

As shown in FIG. 8B, the sparse light sources 812a, 812b, 812c may display the same and/or different information 814a, 814b, 814c in the different locations within or on the sections of the front window 810. For example, the sparse light source 812a may display information 814a of the vehicle speed, the sparse light source 812b may display information 814b of the lane used by the vehicle, and the sparse light source 812c may display information 814a of the time. The information may be textual and/or graphic such that the content provided is alphanumeric, symbolic, or image content. The different locations and/or information may be indicated by the sparse light sources 812a, 812b, 812c in various colors as detected by various sensors of the vehicle, such as a speed monitor changing from green to red when the vehicle speed exceeds the speed limit determined by the sensor or the side of a lane flashing or changing color when a vehicle sensor detects an issue with staying in a particular lane (on the indicated side).

The locations and particular information shown in FIG. 8B is merely exemplary. In other embodiments, rather than isolated portions of the front window 810 being provided with the sparse light sources 812a, 812b, 812c, substantially the entirety of the front window 810 may be provided with the sparse light sources 812a, 812b, 812c. In some embodiments, edges of the front window 810 may be used to route signals and power for control and driving of the sparse light sources 812a, 812b, 812c via conductors (which may be transparent or visible).

The front window 810 may have portions that are substantially planar or relatively gently curved compared to edges of the front window 810, which may have a relatively larger radius of curvature. The light output of the sparse light sources 812a, 812b, 812c may not be appreciably affected by this change in the radius of curvature due to small size of (and thus the locally small radius of curvature at) the individual LEDs in the sparse light sources 812a, 812b, 812c.

Both the size and the number of tiles used to provide the sparse light sources 812a, 812b, 812c in the different locations of the front window 810 may be different.

Figure 9B:
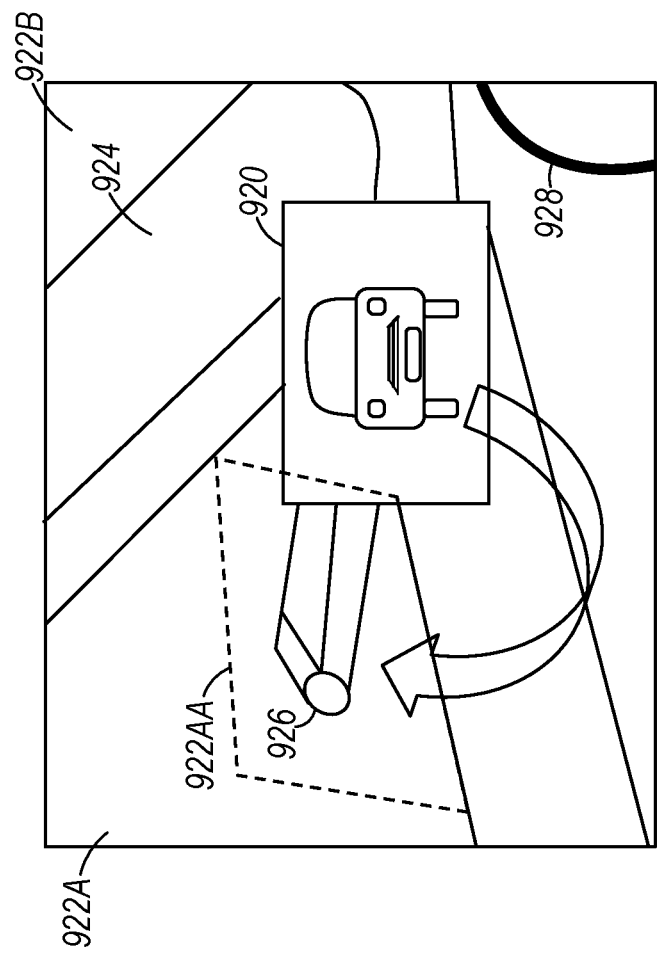
FIG. 9B shows another example of an arrangement, in accordance with some examples.
Figure 9A:
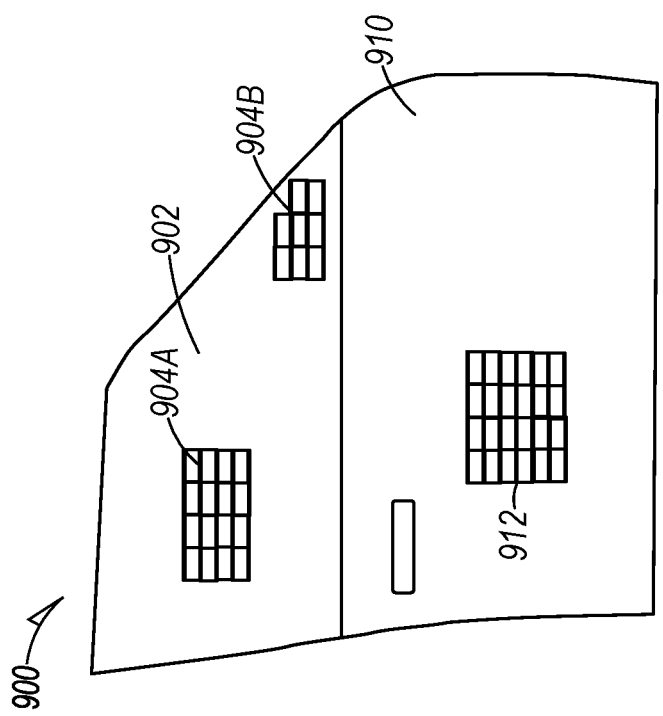
FIG. 9A shows another example of a vehicular sparse array arrangement, in accordance with some examples.

This variation in size and number of tiles is similarly shown in FIG. 9A, which shows another example of a vehicular sparse array arrangement 900, in accordance with some examples. For example, as shown in the vehicular sparse array arrangement 900 of FIG. 9A, one or more sparse light sources 904a, 904b may be disposed on or within a side window 902 of the vehicle and may be disposed one or more sparse light sources 912 may be disposed on a side panel 910 of the vehicle (e.g., covered by a protective transparent layer).

In some embodiments, rather than providing a side view mirror, one of the sparse light sources 904b may be provided at a window position through which an operator of the vehicle would have been able to view the side view mirror. This sparse light source 904b may be used to generate an image that is similar to that provided by the side view mirror. This image may be generated using cameras and other sensors in place of the mirror and/or in other locations of the vehicle (e.g., rear and/or side cameras) and processed by the processor to be displayed by the sparse light source 904b. This permits the side view mirror to be replaced by electronics or other systems, or to be entirely removed, if desired, allowing for a more aerodynamic vehicle design, reducing the likelihood of damage to the vehicle (specifically the side view mirror), and providing another location for system electronics, among others. Note that while the sparse light sources have been shown as rectangular, in some embodiments they may be formed in other shapes and may be individually controlled.

Alternatively, a display replacing the side view mirror may be disposed at a different location, such as the dashboard of the vehicle. This display is shown in FIG. 9B, which shows another example of an arrangement, in accordance with some examples. In FIG. 9B a display 920 that contains a sparse or non-sparse LED array may be mounted on the frame 924 of the vehicle adjacent to the steering wheel 928 and between the side window 922a and the front window 922b. The image in the display 920 may be provided by a sensor 926 that takes the place of the side view mirror. The sensor 926, as above, may include a camera as well as other electronics. The image from the camera may be displayed on the display 920 may be similar to that seen through the side window 922a as indicated by the viewpoint 922aa. In addition, other information may be provided on the display 920 as controlled by a center control consul in the vehicle.

Figure 9C:
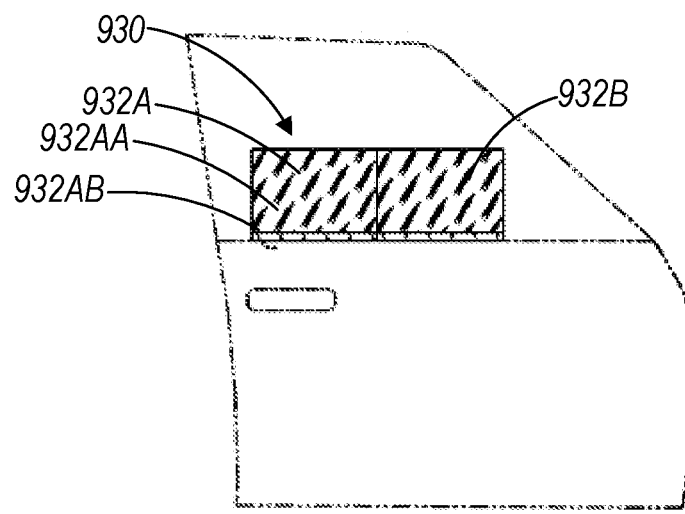
FIG. 9C shows another example of a vehicular sparse array arrangement, in accordance with some examples.

FIG. 9C shows another example of a vehicular sparse array arrangement, in accordance with some examples. The panel 930 in FIG. 9C includes multiple tiles 932a, 932b of the same size. Each tile 932a, 932b may include a sparse LED array 932aa and a control region 932ab at one edge of the tile 932a, 932b.

Figure 9D:
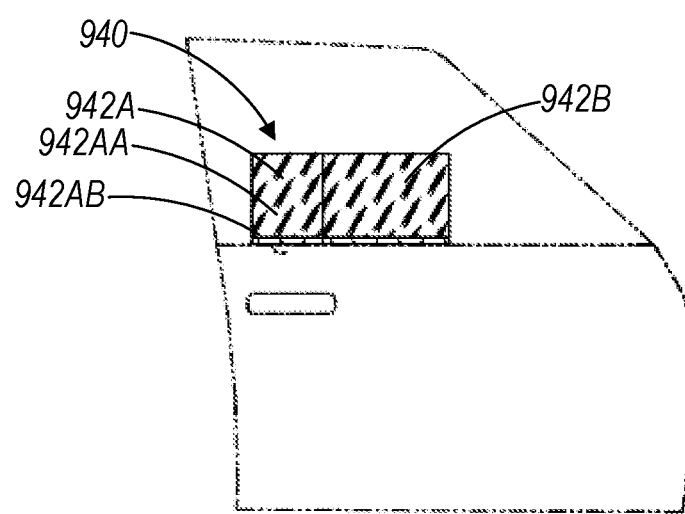
FIG. 9D shows another example of a vehicular sparse array arrangement, in accordance with some examples.

FIG. 9D shows another example of a vehicular sparse array arrangement, in accordance with some examples. The panel 940 in FIG. 9C includes multiple tiles 942a, 942b of different sizes. Each tile 942a, 942b may include a sparse LED array 942aa and a control region 942ab at one edge of the tile 942a, 942b. Note that although the tiles 942a, 942b may be of different sizes, the distance between LEDs of the sparse LED array 942aa may remain the same in each of the tiles 942a, 942b.

Although FIGS. 8A-8B show providing the information to an internal compartment of the vehicle for viewing by occupants of the vehicle, the same or different information may instead or in addition be provided externally at the locations. Similarly, multiple locations in FIG. 9A may be used for internal and/or external display using the sparse light sources 904a, 904b in addition to multiple locations being used for external display using the sparse light sources 912. In some cases, sensors in the vehicle (e.g., using infrared light) may be used to track viewing of particular information by occupants of the vehicle provided to the occupants of the vehicle. This sensor information may be used to adjust the information provided by a particular sparse light source.

Figure 10:
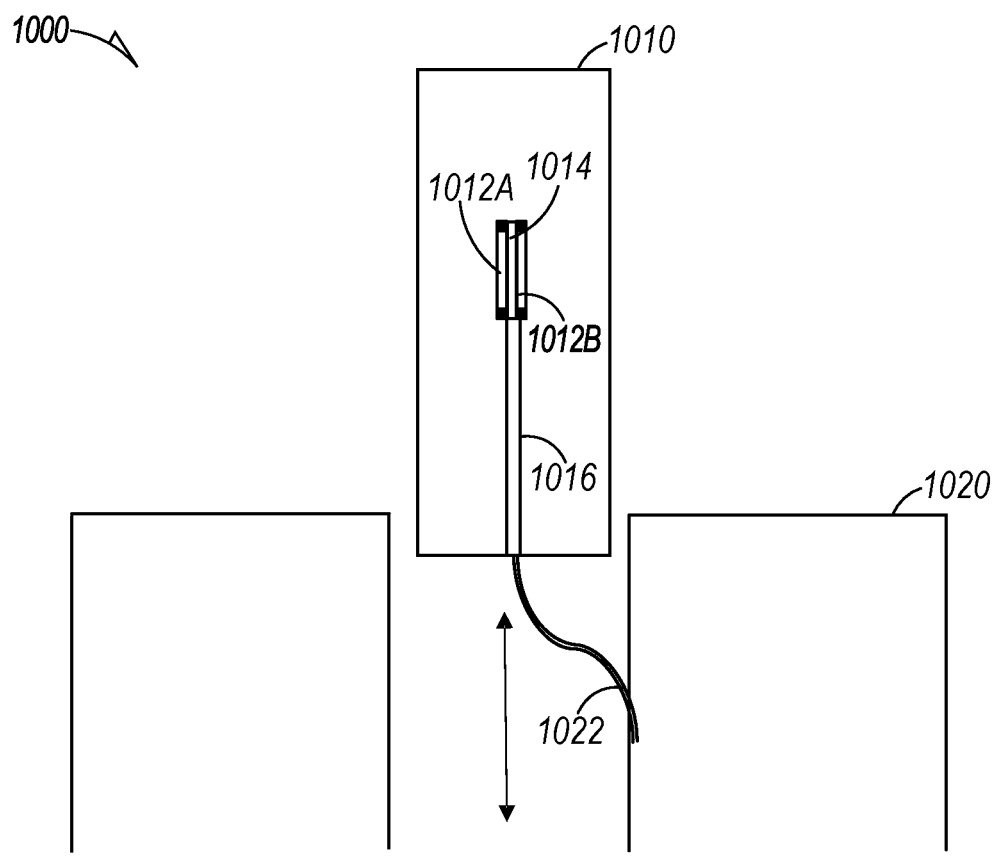
FIG. 10 shows another example of a vehicular sparse array arrangement, in accordance with some examples.

FIG. 10 shows another example of a vehicular sparse array arrangement 1000, in accordance with some examples. In the sparse array arrangement 1000 in FIG. 10, a window 1010 is retained between the sidewalls of a panel 1020 that form at least part of the vehicle door. The window 1010 may be a side window of the vehicle, for example. As shown, the sparse light source 1014 may contain multiple sparse light arrays 1012a, 1012b disposed back-to-back within panes of glass (or other material) forming the window 1010. Each of the sparse light arrays 1012a, 1012b may be disposed on a non-transparent substrate, thereby limiting viewing of the information projected to only one hemisphere. This may permit different information to be displayed to observers within the vehicle and outside of the vehicle without limiting viewing through the window in either direction. A power connection 1022, such as a cable or wiring to enable control of the sparse light source 1014 via traces 1016 by the processor described herein, may be disposed within a cavity formed by the panel 1020. An end of the power connection 1022 may be retained within the window 1010 to provide a robust electrical connection with the traces 1016.

Figure 11:
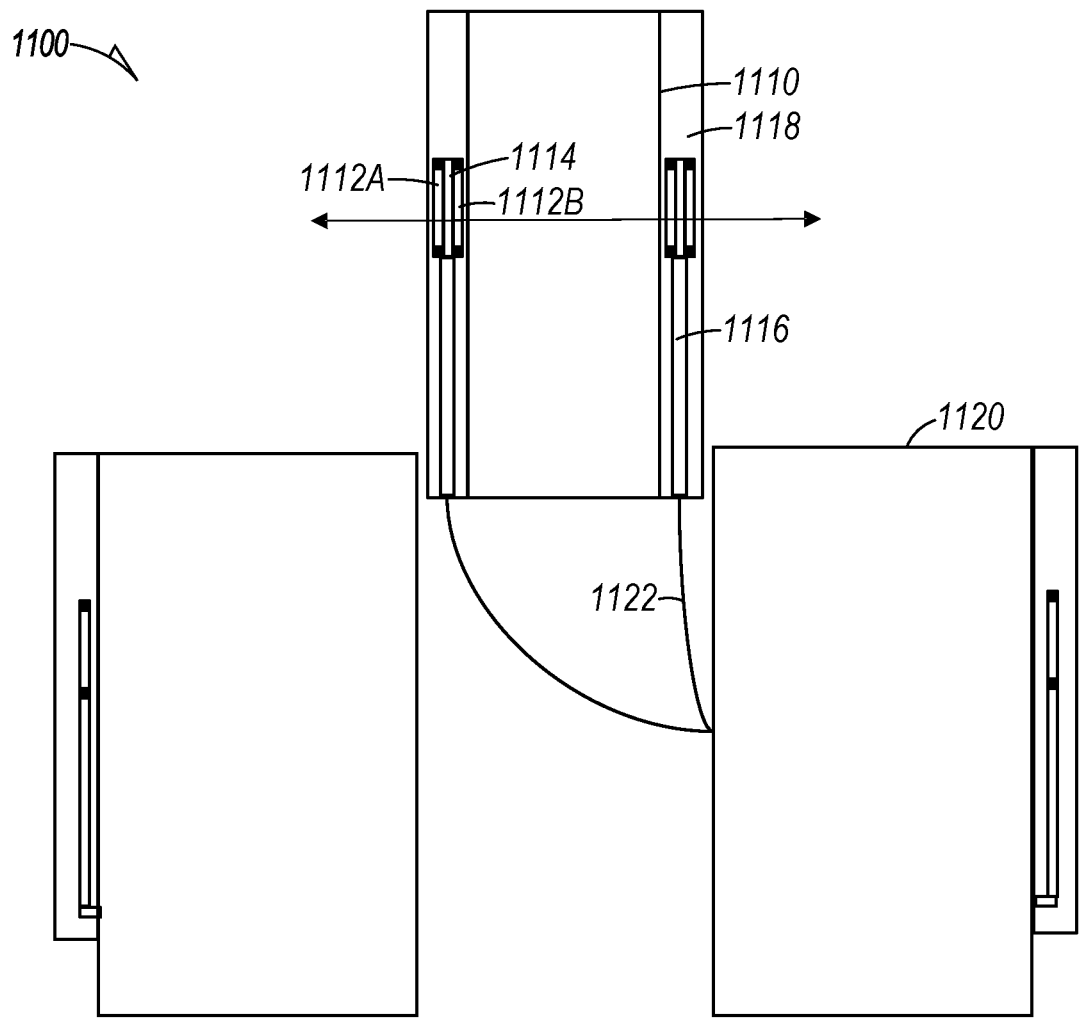
FIG. 11 shows another example of a vehicular array arrangement, in accordance with some examples.

FIG. 11 shows another example of a vehicular array arrangement 1100, in accordance with some examples. In the array arrangement 1100 in FIG. 11, a window 1110 is retained between the sidewalls of a panel 1120 in the vehicle cabin. The window 1110 may be a side window or a front or rear window of the vehicle. As in FIG. 10, the sparse light source 1114 in FIG. 11 may contain multiple sparse light arrays 1112a, 1112b disposed back-to-back. Each of the sparse light arrays 1112a, 1112b may be disposed on a non-transparent substrate, thereby limiting viewing of the information projected to only one hemisphere. This may permit different information to be displayed to observers within the vehicle and outside of the vehicle without limiting viewing through the window in either direction. A power connection 1122, such as a cable or wiring to enable control of the sparse light source 1114 via traces 1116 by the processor described herein, may be disposed within a cavity formed by the panel 1120. An end of the power connection 1122 may be retained within the window 1110 to provide a robust electrical connection with the traces 1116.

Unlike the arrangement shown in FIG. 10, however, the sparse light source 1114 may be disposed on the innermost and/or outermost pane of glass (rather than within the glass) forming the window 1110. A transparent protective layer 1118, such as PET, may be provided to protect the sparse light source 1114. In embodiments in which sparse light sources 1114 are provided on both the innermost and outermost pane of glass and aligned along a predetermined viewing direction shown by the arrow in FIG. 11, a single sided sparse light source 1114 on a non-transparent substrate may be used in both locations.

In further embodiments, other light sources may be disposed on the panel 1120 to be viewable by occupants of the vehicle (interior) and/or viewers outside the vehicle (exterior). As the panel 1120 is non-transparent, the light sources may not be sparse, but may instead be non-sparse arrays fabricated in a similar manner as the sparse arrays and protected by a protective layer.

Figure 12:
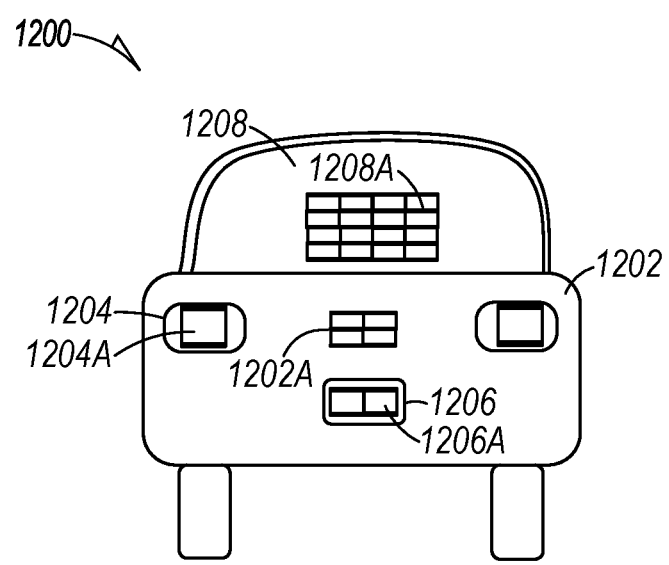
FIG. 12 shows another example of vehicular array arrangements, in accordance with some examples.

FIG. 12 shows another example of vehicular array arrangements 1200, in accordance with some examples. In the array arrangement 1200 in FIG. 12, one or more sparse light arrays 1208*a* may be disposed on or within a rear window 1208 in a manner similar to that provided above. The rear portion of the body of the vehicle 1202 may contain tail housings 1204 in each of which a non-sparse light array 1204*a* is disposed to provide break/hazard and other rear taillight applications. In addition, a body light array 1202*a* may be disposed in a rear portion of the body of the vehicle 1202 and/or a license light array 1206*a* may be within a license plate area 1206 of the vehicle. The body light array 1202*a* and/or license light array 1206*a* may be or include a sparse and/or non-sparse light array. Each of the one or more sparse light arrays 1208*a*, body light array 1202*a*, and license light array 1206*a* may provide the same or different information. For example, the one or more sparse light arrays 1208*a* may indicate that the vehicle is used for commercial purposes (e.g., Uber, Lyft), the body light array 1202*a* may provide a warning that the following car is tailgating (based on sensor information in the vehicle that includes, e.g., both speed of the vehicle and distance between the vehicle and the following vehicle) and license light array 1206*a* that provides the license plate information or an overlay (such as registration date information). Thus, other emitting elements such as visible or infrared LEDs or radar/lidar may be used to sense when the following vehicle is too close and to display a message to the driver of the following vehicle to increase the distance therebetween, without interfering with the driver's ability to see through the rear window. Other textual messages or images may also be conveyed to nearby vehicles.

Other sparse or non-sparse light arrays may be disposed around the vehicle (including for example on the wheel hub) for similar purposes (e.g., advertising, providing information to external and/or internal viewers). In this case, the light arrays may be controlled by the same processor, or a number of different processors may be used dependent on location and/or information to be provided by the light arrays. In some embodiments, the light arrays may be used to change the color of the vehicle, at least in different locations if not substantially the entire vehicle to provide a "skin" of one or more different colors. As other displays using LED arrays, the information displayed may change periodically.

Figure 13A:
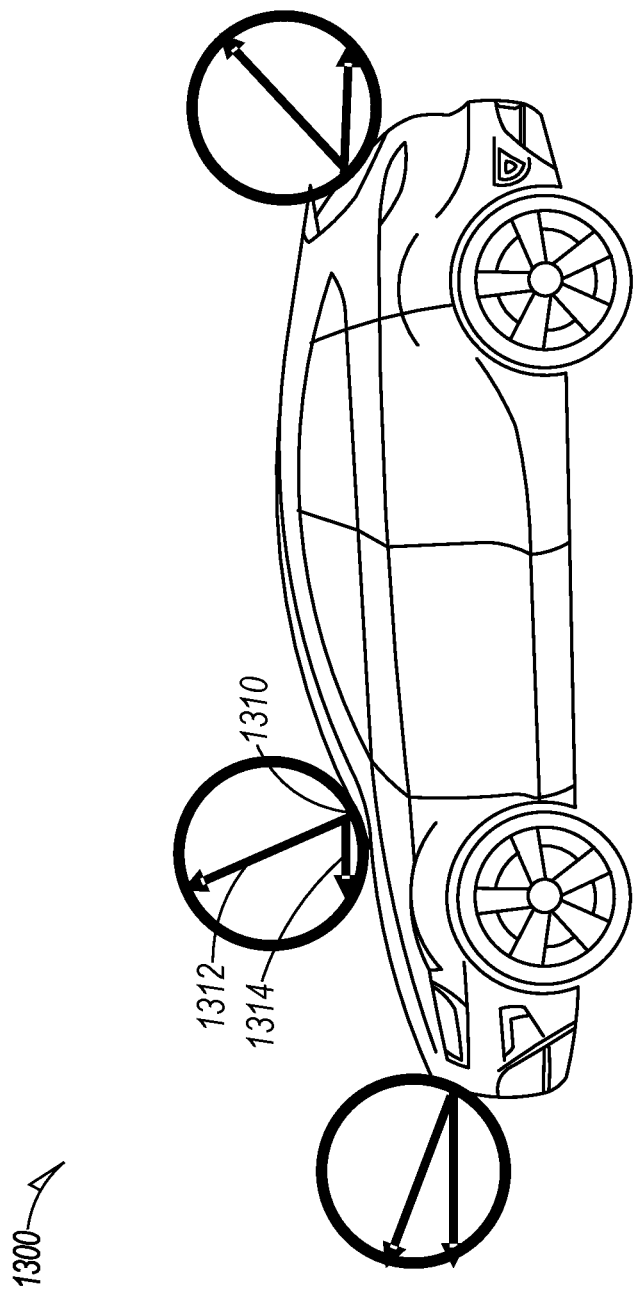
FIG. 13A illustrates an example of optimized light emission for an external viewer in accordance with various embodiments of the disclosed subject-matter.
Figure 13B:
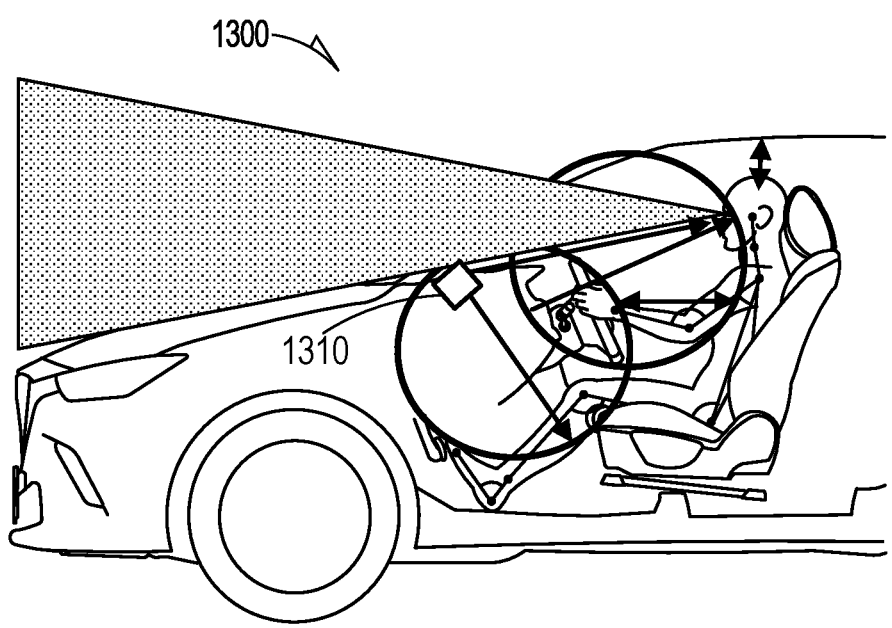
FIG. 13B illustrates an example of optimized light emission for an internal viewer (as shown, the vehicle operator) in accordance with various embodiments of the disclosed subject-matter.

FIGS. 13A-13B show an example of a vehicle 1300, in accordance with some examples. The vehicle 1300 may contain multiple light sources 1310 that include sparse arrays in various locations around the vehicle 1300. Each light source 1310 may emit light in a direction substantially symmetrical around a normal direction 1312 that is normal to the underlying portion of the vehicle 1300 on which each light source 1310 is disposed. In some embodiments, the light from each light source 1310 may radiate in a Lambertian pattern, for example. However, as shown, propagation of the light in the normal direction 1312 may result in a diminished viewing capacity as a significant portion of the light is directed towards a direction that is not viewable.

To this end, one or more optical elements in the sparse array of the light source 1310 may be used to adjust the emission angle to an optimized direction 1314 in which the (Lambertian) pattern of the emitted light centers around a primary non-normal viewing angle for a fixed viewing position. The angular difference between the normal direction 1312 and the optimized direction 1314, and thus correction provided by the optical elements, may depend on the portion of the vehicle 1300 on which the light source 1310 is attached (and thus from which the light source emits). In other embodiments, the light source 1310 may be non-planar with the material in which the light source 1310 is embedded (i.e., the emission surface of the light source 1310 may disposed at a non-parallel angle with respect to a surface of the window in which the light source 1310 is embedded). FIG. 13A illustrates an example of optimized light emission for an external viewer in accordance with various embodiments of the disclosed subject-matter; FIG. 13B illustrates an example of optimized or desired light emission for an internal viewer (as shown, the vehicle operator) in accordance with various embodiments of the disclosed subject-matter. In some embodiments, light from the light source 1310 may be emitted substantially parallel to the surface on which the vehicle is traveling.

That is, the Lambertian radiation pattern of the light source 1310 may skew brightness at a predictable viewing angle following the cosine law where the brightest display viewing angle is directly on axis and the brightness diminishes as the angle goes off axis. Therefore, when placed in a setting with a fixed display position and a relatively fixed viewer (driver, passengers), the display brightness for a particular viewer can be well understood. This may help designing in performance of such displays using the ability of microLEDs to tailor the radiation pattern away from Lambertian to create peak intensities that do not occur on axis. The light source 1310 may be designed or shaped to provide a peak off-axis intensity and may be useful in displays for example are on surfaces that are at an angle, such as a windshield or a hatchback glass. Optical elements may also be included with each individual microLED to produce this effect or microLEDs may be specifically created for an optimized application specific viewing angle. In some embodiments, proximity sensors or cameras may be used to allow the processor to determine the presence of a viewer (whether internal or external) of the light source 1310 as well as an angle at which the peak intensity is to be adjusted to maximize display to the viewer and mechanically and/or optically adjust the angle accordingly.

In some circumstances, the distance and angle between the light sources (LEDs) and the eye of an observer may vary, leading to differences in optical power to produce an adequately detectable signal. This is also true of various detectors, which may result in higher sensitivity detectors and/or emitters being used. As above, it would be desirable to provide a light source that may either be placed at a location to provide viewing at an angle normally observable by an individual of interest or mechanically or optically adjustable as desired.

In some embodiments, the various sparse LED arrays may have (capacitive) touch sensors embedded therein. This may permit a user (e.g., the vehicle operator or passenger) to adjust information provided on one or more of the panels. The information adjusted by the user may be provided to occupants of the vehicle (internal) and/or provided to individuals outside the vehicle (external).

Figure 14:
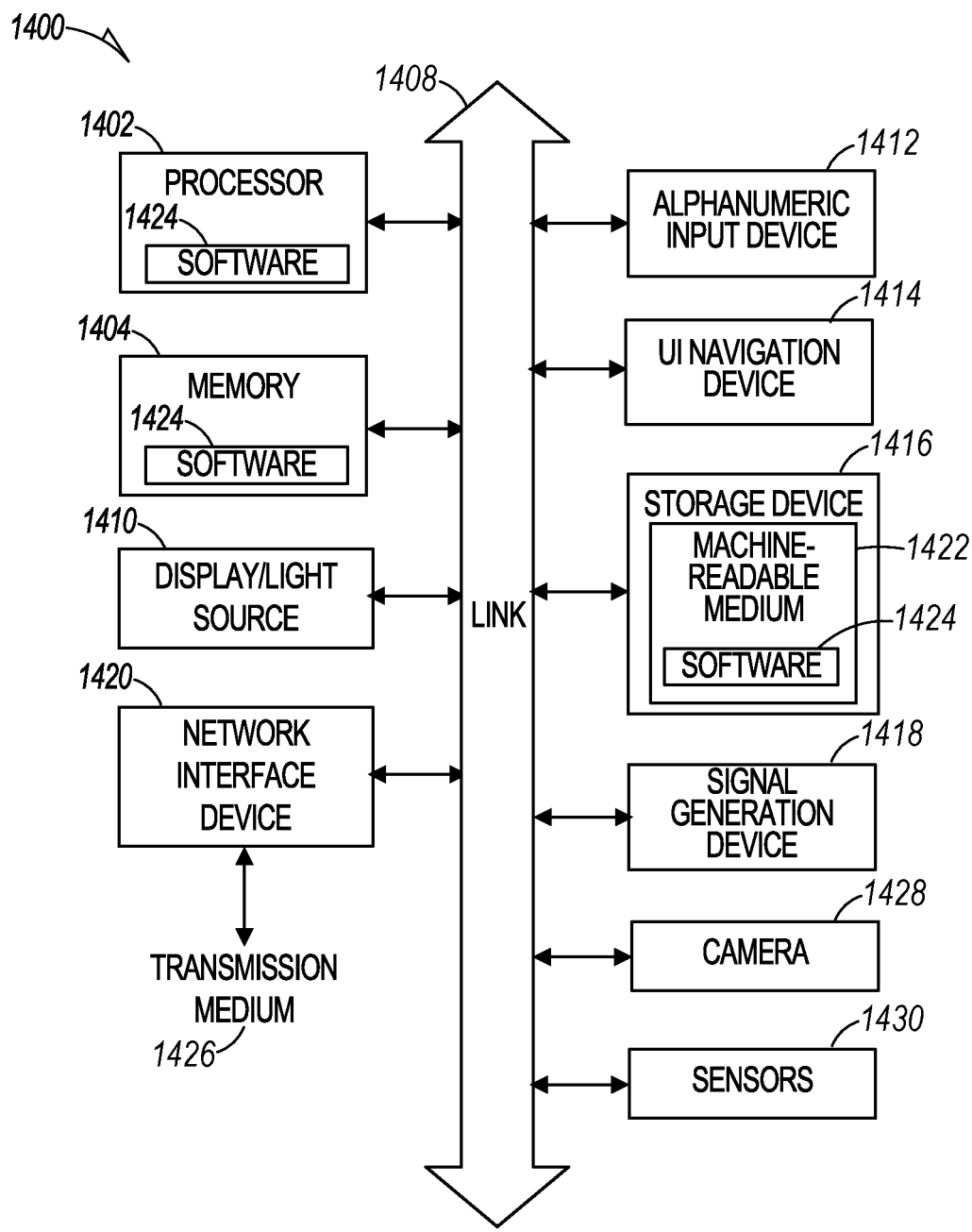
FIG. 14 illustrates an example of a general device in accordance with some embodiments.

FIG. 14 illustrates an example of a general device 1400 in accordance with some embodiments. The device 1400 may be a vehicle-embedded display for example. Various elements may be provided on a backplane indicated above, while other elements may be local or remote. Examples, as described herein, may include, or may operate on, logic or a number of components, modules, or mechanisms.

Modules and components are tangible entities (e.g., hardware) capable of performing specified operations and may be configured or arranged in a certain manner. In an example, circuits may be arranged (e.g., internally or with respect to external entities such as other circuits) in a specified manner as a module. In an example, the whole or part of one or more computer systems (e.g., a standalone, client or server computer system) or one or more hardware processors may be configured by firmware or software (e.g., instructions, an application portion, or an application) as a module that operates to perform specified operations. In an example, the software may reside on a machine readable medium. In an example, the software, when executed by the underlying hardware of the module, causes the hardware to perform the specified operations.

Accordingly, the term "module" (and "component") is understood to encompass a tangible entity, be that an entity that is physically constructed, specifically configured (e.g., hardwired), or temporarily (e.g., transitorily) configured (e.g., programmed) to operate in a specified manner or to perform part or all of any operation described herein. Considering examples in which modules are temporarily configured, each of the modules need not be instantiated at any one moment in time. For example, where the modules comprise a general-purpose hardware processor configured using software, the general-purpose hardware processor may be configured as respective different modules at different times. Software may accordingly configure a hardware processor, for example, to constitute a particular module at one instance of time and to constitute a different module at a different instance of time.

The electronic device 1400 may include a hardware processor (or equivalently processing circuitry) 1402 (e.g., a central processing unit (CPU), a GPU, a hardware processor core, or any combination thereof), a memory 1404 (which may include main and static memory), some or all of which may communicate with each other via an interlink (e.g., bus) 1408. The memory 1404 may contain any or all of removable storage and non-removable storage, volatile memory or non-volatile memory. The electronic device 1400 may further include a display/light source 1410 such as the LEDs described above, or a video display, an alphanumeric input device 1412 (e.g., a keyboard), and a user interface (UI) navigation device 1414 (e.g., a mouse). In an example, the display/light source 1410, input device 1412 and UI navigation device 1414 may be a touch screen display. The electronic device 1400 may additionally include a storage device (e.g., drive unit) 1416, a signal generation device 1418 (e.g., a speaker), a network interface device 1420, one or more cameras 1428, and one or more sensors 1430, such as a global positioning system (GPS) sensor, compass, accelerometer, or other sensor such as those described herein. The electronic device 1400 may further include an output controller, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.). Some of the elements, such as one or more of the sparse arrays that provide the display/light source 1410 may be remote from other elements and may be controlled by the hardware processor 1402.

The storage device 1416 may include a non-transitory machine readable medium 1422 (hereinafter simply referred to as machine readable medium) on which is stored one or more sets of data structures or instructions 1424 (e.g., software) embodying or utilized by any one or more of the techniques or functions described herein. The instructions 1424 may also reside, completely or at least partially, within the memory 1404 and/or within the hardware processor 1402 during execution thereof by the electronic device 1400. While the machine readable medium 1422 is illustrated as a single medium, the term "machine readable medium" may include a single medium or multiple media (e.g., a centralized or distributed database, and/or associated caches and servers) configured to store the one or more instructions 1424.

The term "machine readable medium" may include any medium that is capable of storing, encoding, or carrying instructions for execution by the electronic device 1400 and that cause the electronic device 1400 to perform any one or more of the techniques of the present disclosure, or that is capable of storing, encoding or carrying data structures used by or associated with such instructions. Non-limiting machine-readable medium examples may include solid-state memories, and optical and magnetic media. Specific examples of machine-readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; Random Access Memory (RAM); and CD-ROM and DVD-ROM disks.

The instructions 1424 may further be transmitted or received over a communications network using a transmission medium 1426 via the network interface device 1420 utilizing any one of a number of wireless local area network (WLAN) transfer protocols or a SPI or CAN bus. Example communication networks may include a local area network (LAN), a wide area network (WAN), a packet data network (e.g., the Internet), mobile telephone networks (e.g., cellular networks), Plain Old Telephone (POTS) networks, and wireless data networks. Communications over the networks may include one or more different protocols, such as Institute of Electrical and Electronics Engineers (IEEE) 802.11 family of standards known as Wi-Fi, IEEE 802.16 family of standards known as WiMax, IEEE 802.16.4 family of standards, a Long Term Evolution (LTE) family of standards, a Universal Mobile Telecommunications System (UMTS) family of standards, peer-to-peer (P2P) networks, a next generation (NG)/$6^{th}$ generation (6G) standards among others. In an example, the network interface device 1420 may include one or more physical jacks (e.g., Ethernet, coaxial, or phone jacks) or one or more antennas to connect to the transmission medium 1426.

Note that the term "circuitry" as used herein refers to, is part of, or includes hardware components such as an electronic circuit, a logic circuit, a processor (shared, dedicated, or group) and/or memory (shared, dedicated, or group), an Application Specific Integrated Circuit (ASIC), a field-programmable device (FPD) (e.g., a field-programmable gate array (FPGA), a programmable logic device (PLD), a complex PLD (CPLD), a high-capacity PLD (HCPLD), a structured ASIC, or a programmable SoC), digital signal processors (DSPs), etc., that are configured to provide the described functionality. In some embodiments, the circuitry may execute one or more software or firmware programs to provide at least some of the described functionality. The term "circuitry" may also refer to a combination of one or more hardware elements (or a combination of circuits used in an electrical or electronic system) with the program code used to carry out the functionality of that program code. In these embodiments, the combination of hardware elements and program code may be referred to as a particular type of circuitry.

The term "processor circuitry" or "processor" as used herein thus refers to, is part of, or includes circuitry capable of sequentially and automatically carrying out a sequence of arithmetic or logical operations, or recording, storing, and/or transferring digital data. The term "processor circuitry" or "processor" may refer to one or more application processors, one or more baseband processors, a physical central processing unit (CPU), a single- or multi-core processor, and/or any other device capable of executing or otherwise operating computer-executable instructions, such as program code, software modules, and/or functional processes.

The camera 1428 may sense light at least the wavelength or wavelengths emitted by the LEDs. The camera 1428 may include optical elements (e.g., at least one camera lens) that are able to collect reflected light of illumination that is reflected from and/or emitted by an illuminated region. The camera lens may direct the reflected light onto a multi-pixel sensor (also referred to as a light sensor) to form an image of on the multi-pixel sensor.

The processor 1402 may control and drive the LEDs via one or more drivers. For example, the processor 1402 may optionally control one or more LEDs in LED arrays independent of another one or more LEDs in the LED arrays, so as to illuminate an area in a specified manner.

In addition, the sensors 1430 may be incorporated in the camera 1428 and/or the light source 1410. The sensors 1430 may sense visible and/or infrared light and may further sense the ambient light and/or variations/flicker in the ambient light in addition to reception of the reflected light from the LEDs. The sensors may have one or more segments (that are able to sense the same wavelength/range of wavelengths or different wavelength/range of wavelengths), similar to the LED arrays.

Figure 15:
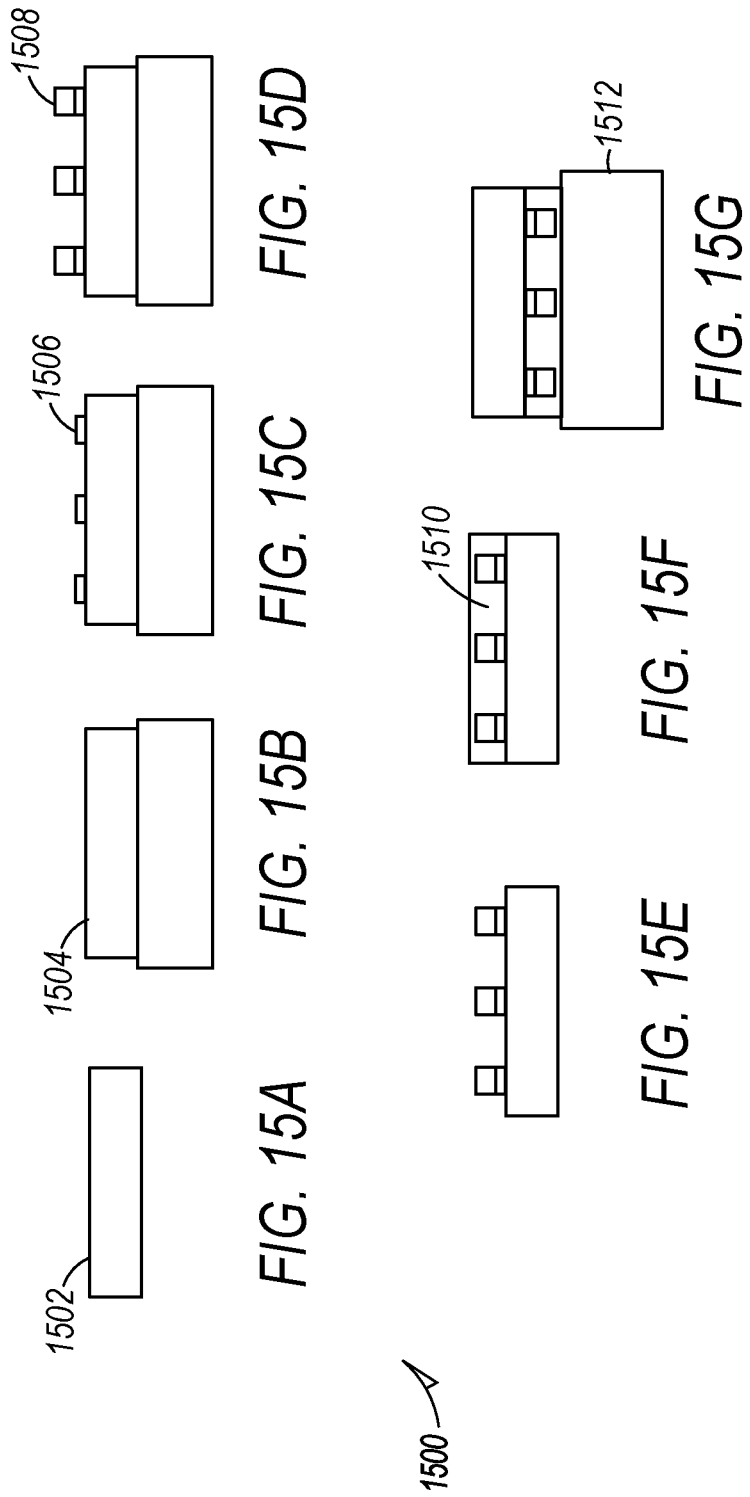
FIGS. 15A-15G illustrates an example of process operations of fabricating the sparse array in accordance with some embodiments.
Figure 16:
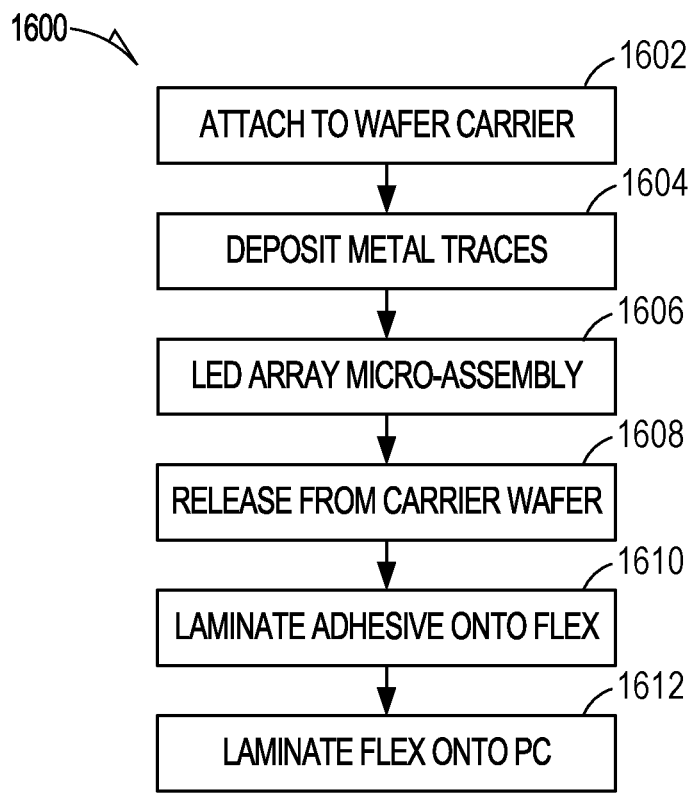
FIG. 16 illustrates an example of a method of fabricating the sparse array in accordance with the process operations shown in FIGS. 15A-15G.

FIGS. 15A-15G illustrate an example of a process 1500 of fabricating the sparse array in accordance with some embodiments. FIG. 16 illustrates an example of a method 1600 of fabricating the sparse array in accordance with the process operations shown in FIGS. 15A-15G. The process starts in FIG. 15A with a transparent flexible sheet 1502. At operation 1602 in FIG. 16, the transparent flexible sheet 1502 may be attached to a carrier wafer 1504 as depicted in FIG. 15B. At operation 1604, metal traces 1506 may be deposited on the transparent flexible sheet 1502 as shown in FIG. 15C. At operation 1606, the LED array 1508 may be assembled on the metal traces 1506 as shown in FIG. 15D. At operation 1608, the transparent flexible sheet 1502 containing the metal traces 1506 and the LED array 1508 may be released from the carrier wafer 1504 as shown in FIG. 15E. At operation 1610, an adhesive layer 1510 may be laminated on the transparent flexible sheet 1502 to cover the metal traces 1506 and the LED array 1508 as shown in FIG. 15F. At operation 1612, the transparent flexible sheet 1502 may be flipped and laminated onto a printed circuit board 1512 as shown in FIG. 15G.

In other embodiments, a backplane with traces may be formed on the transparent substrate. The sparse LED array (which may contain microLEDs) may be transferred onto the transparent substrate with the backplane. The transfer may be performed, for example, using a mass transfer process to provide the sparse LED array. The mass transfer may be used to deposit the microLEDs (and microIC) mass on the transparent substrate by picking the location with stamps and tethering or anchoring the transferred material using an adhesive layer, for example. The transfer may be performed, in another example, using one or more print nozzles arrayed in parallel to provide the sparse LED array in a vacuum nozzle transfer process. The print nozzles may be an ENJET tool adapted for this process. The laminated structure may then be formed in either case. In other embodiments, after transfer, specific microLEDs may be repaired or replaced using the ENJET Tool.

Alternatively, traces may be formed on the transparent substrate. The LEDs may then be formed on the transparent substrate and the laminated structure formed as above.

Figure 17:
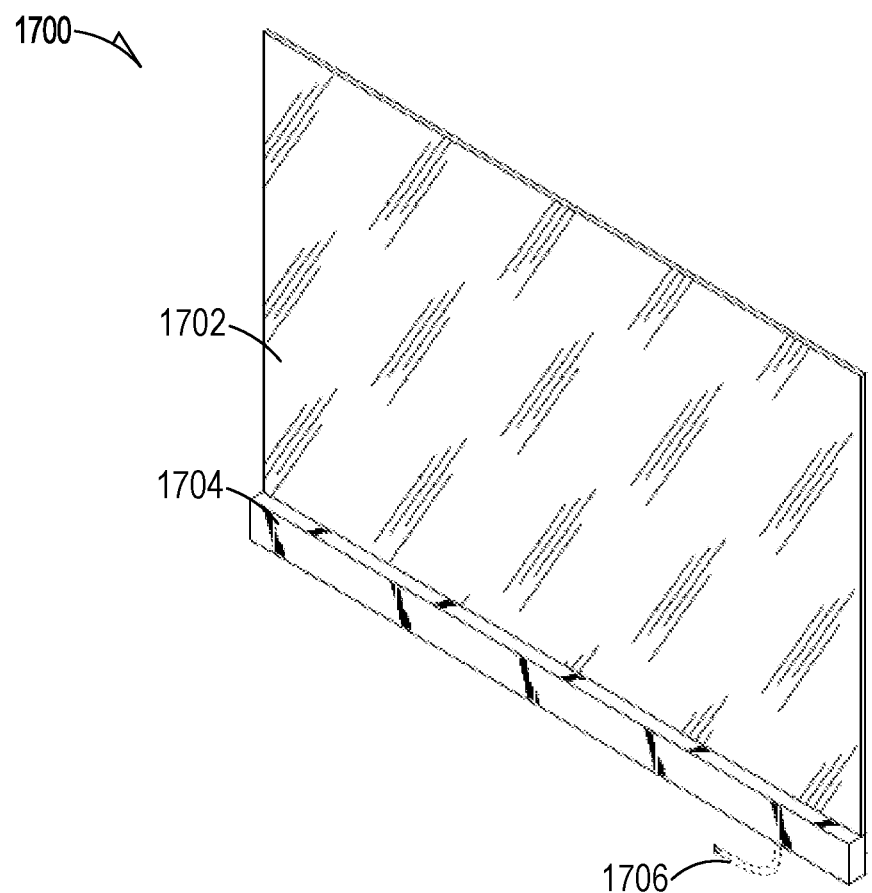
FIG. 17 illustrates an example of a single display tile in accordance with some embodiments.

FIG. 17 illustrates an example of a single display tile 1700 in accordance with some embodiments. The display tile 1700 may include a sparse LED array 1702, an electronics edge 1704, and a connector 1706 electrically coupled to the electronics edge 1704. The various components are described above. In an off mode, the single display tile 1700 is transparent. The single display tile 1700 may provide display on a single side.

Figure 18B:
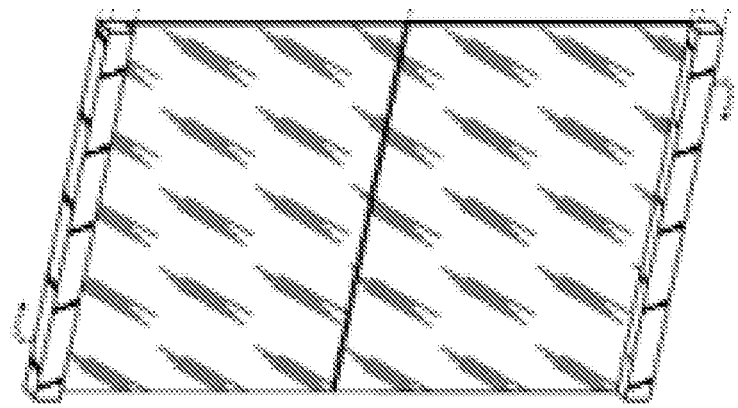
FIGS. 18A-18B illustrate an example of a multiple display tile in accordance with some embodiments.
Figure 18A:
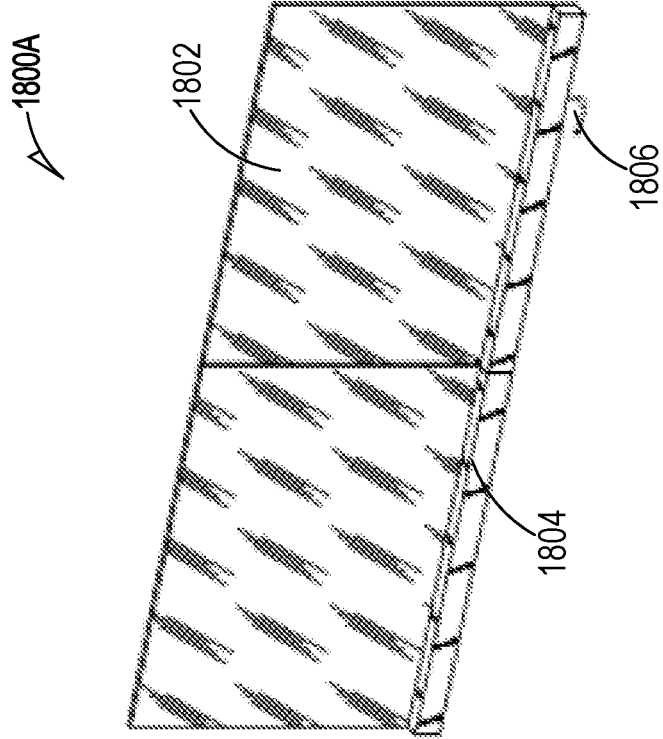

FIGS. 18A-18B illustrate an example of a multiple display tile 1800a, 1800b in accordance with some embodiments. Similar to FIG. 17, each tile of the multiple display tile 1800a, 1800b in FIGS. 18A and 18B may include a sparse LED array 1802, an electronics edge 1804, and a connector 1806 electrically coupled to the electronics edge 1804. For the rectangular tiles shown in FIGS. 18A-18B, in FIG. 18A the electronics edge 1804 of the multiple display tile 1800a may be disposed along a single continuous edge that forms the long edge of the multiple display tile 1800a (with the short edge being common between the rectangular tiles); in FIG. 18B the electronics edge 1804 of the multiple display tile 1800b may be disposed along opposing edges that form the short edges of the multiple display tile 1800b (with the long edge being common between the rectangular tiles). In an off mode, the multiple display tile 1800b is transparent. The multiple display tile 1800b may provide display on a single side. In FIGS. 18A and 18B the tiles are the same size; in other embodiments the tiles may be different sizes.

Figure 19:
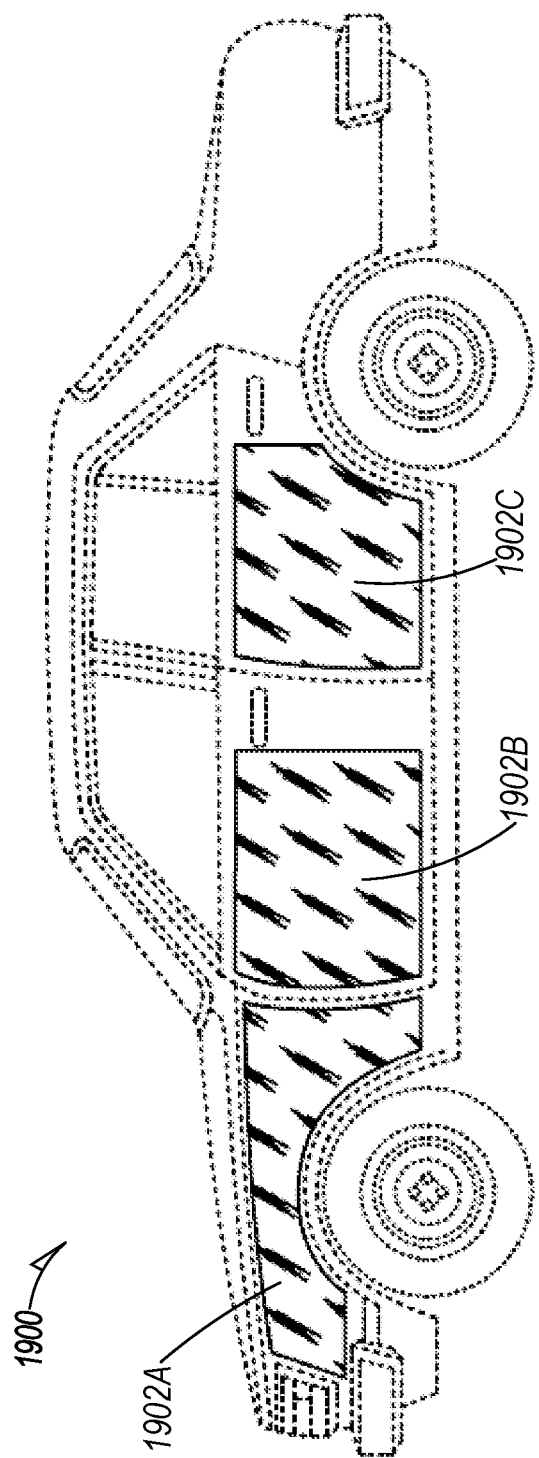
FIG. 19 illustrates an example of a vehicle in accordance with some embodiments.

FIG. 19 illustrates an example of a vehicle 1900 in accordance with some embodiments. The vehicle 1900 illustrates light sources 1902a, 1902b, 1902c that each contain sparse LED arrays disposed on different panels of the vehicle 1900. The light sources 1902a, 1902b, 1902c may be, as shown, of different sizes and shapes and may cover substantially the entirety of the panels, thereby permitting a wide variety of information or lighting described above to be provided over the panels. The light sources 1902a, 1902b, 1902c may be protected using a protective coating as noted above.

As described herein, the information provided by the various light sources may be projected from the light source either internally and externally respectively for internal and external viewers. In other embodiments, a blocking layer disposed between the light source and the desired viewer (e.g., the LED array and the outer surface of the light source containing the LED array). The blocking layer may be used in conjunction with the light source to convey the information by controlling different portions of the blocking layer to block the light from specific microLEDs or sets of microLEDs in the array of the light source from reaching the desired viewer. Alternatively, the blocking layer may be used to increase contrast of components of the light source (e.g., outlining alphanumeric information in a dark penumbra).

In the various embodiments described herein, a user may control the internal and external display provided by the light sources herein. The user control may be via user inputs on the display, on a different display, and/or an external electronic device such as through the use of an app on a smartphone or laptop.

The use of the transparent displays described herein, which are enabled by microLEDs, may be able to expand capability in both user experience and vehicle operation by integrating with interior and exterior panels as well as window glass. In the case of window glass, transparent displays may also enhance the external user experience by providing signage, interactive menus, entrance criteria, public information, and many other cases. The internal user experience may also be enhanced by allowing for rich augmented reality (AR) experiences in the windshield, replacing side view mirrors with displays on side glass pieces, entertainment for passengers, and many other cases. Both internal and external display functionality may, in some embodiments, with the same display, enabled by effectively being able to produce similar quality images on both of its sides, therefore effectively creating a two-way display, which may be extended beyond automotive into consumer, industrial, and commercial settings.

Examples

Example 1 is a vehicular display, comprising: at least one tile configured to be disposed in a vehicle to provide a display of information, each of the at least one tile including: a transparent flexible substrate; a sparse array of light-emitting diodes (LEDs) disposed on the transparent flexible substrate; a transparent rigid substrate attached to the transparent flexible substrate; and at least one driver disposed on an edge of the tile and configured to drive the LEDs of the sparse array of LEDs.

In Example 2, the subject matter of Example 1 includes, wherein: the rigid substrate is adhered to the transparent flexible substrate via an adhesive layer in which the sparse array of LEDs is encapsulated; and the vehicular display further comprises electrical traces configured to electrically power the LEDs of the sparse array of LEDs.

In Example 3, the subject matter of Examples 1-2 includes, wherein the at least one tile includes: a first tile configured to display first information in a first direction; and a second tile having a second emission surface configured to display second information in a second direction opposite the first direction.

In Example 4, the subject matter of Examples 1-3 includes, a sensor configured to provide images corresponding to information provided by a side window mirror, wherein the at least one tile is configured to replace visual information provided by the side window mirror with the images.

In Example 5, the subject matter of Examples 1-4 includes, wherein: the at least one tile is configured to be disposed on or within multiple discrete locations of a window of the vehicle, and the at least one tile is configured to display vehicle information to an internal compartment of the vehicle.

In Example 6, the subject matter of Examples 1-5 includes, wherein: the at least one tile includes a first tile and a second tile adjacent to the first tile, the LEDs within each of the first tile and the second tile are separated by a substantially uniform distance in substantially orthogonal directions, and the LEDs at a common edge of the first tile and the second tile are separated by the substantially uniform distance.

In Example 7, the subject matter of Example 6 includes, wherein the at least one driver includes: a first driver disposed along an edge of the first tile substantially perpendicular to the common edge and configured to drive the first tile, and a second driver configured to drive the second tile, the second driver adjacent to the first driver and disposed along an edge of the second tile substantially perpendicular to the common edge.

In Example 8, the subject matter of Examples 1-7 includes, wherein the LEDs comprise optical elements that adjust an angle of emission of the LEDs from a normal angle to a predetermined non-normal angle.

In Example 9, the subject matter of Examples 1-8 includes, a sensor and processor configured to detect presence of a viewer and an angle of peak intensity to maximize display of information projected by the at least one tile to the viewer, and at least one of mechanically and optically adjust the angle accordingly.

In Example 10, the subject matter of Examples 1-9 includes, wherein at least one of the at least one tile includes a user input configured to adjust information provided by the at least one of the at least one tile.

In Example 11, the subject matter of Examples 1-10 includes, wherein information provided by the at least one tile is configured to be adjusted by a remote user input on a mobile device.

In Example 12, the subject matter of Examples 1-11 includes, wherein the at least one tile further comprises a blocking layer disposed between the sparse array of LEDs and an outer surface of the at least one tile, the blocking layer configured to convey information by controlling different portions of the blocking layer to block light from specific LEDs from being emitted from the outer surface.

In Example 13, the subject matter of Examples 1-12 includes, wherein the at least one tile further comprises a blocking layer disposed between the sparse array of LEDs and an outer surface of the at least one tile, the blocking layer configured to increase contrast of information conveyed by the at least one tile by outlining alphanumeric information projected from the sparse array of LEDs in a dark penumbra.

Example 14 is a vehicular display, comprising: at least one tile configured to be disposed in a vehicle to provide a display of information, each of the at least one tile including: a transparent flexible substrate; a sparse array of individually-controllable micro light-emitting diodes (microLEDs)

disposed on the transparent flexible substrate; and a transparent rigid substrate attached to the transparent flexible substrate.

In Example 15, the subject matter of Example 14 includes, wherein the at least one tile includes: a first tile configured to display first information in a first direction; and a second tile having a second emission surface configured to display second information in a second direction opposite the first direction.

In Example 16, the subject matter of Examples 14-15 includes, a sensor configured to provide images corresponding to information provided by a side window mirror, wherein the at least one tile is configured to replace visual information provided by the side window mirror with the images.

In Example 17, the subject matter of Examples 14-16 includes, wherein: the at least one tile includes a first tile and a second tile adjacent to the first tile, the microLEDs within each of the first tile and the second tile are separated by a substantially uniform distance in substantially orthogonal directions, and the microLEDs at a common edge of the first tile and the second tile are separated by the substantially uniform distance.

In Example 18, the subject matter of Examples 14-17 includes, a sensor and processor configured to detect presence of a viewer and an angle of peak intensity to maximize display of information projected by the at least one tile to the viewer, and at least one of mechanically and optically adjust the angle accordingly.

In Example 19, the subject matter of Examples 14-18 includes, wherein at least one of: the at least one tile includes a user input configured to adjust information provided by the at least one tile, and the information provided by the at least one tile is configured to be adjusted by a remote user input on a mobile device.

Example 20 is a vehicular display, comprising: at least one tile configured to be disposed in a vehicle to provide a display of information, each of the at least one tile including: a transparent flexible substrate; a sparse array of individually-controllable micro light-emitting diodes (microLEDs) disposed on the transparent flexible substrate; a transparent rigid substrate attached to the transparent flexible substrate; and at least one driver disposed on an edge of the tile and configured to drive the microLEDs of the sparse array of microLEDs, and at least one of the at least one tile includes, a user input configured to adjust information provided by the at least one tile or the information provided by the at least one tile is configured to be adjusted by a remote user input on a mobile device.

In Example 21, the subject matter of Example 20 includes, wherein: the at least one tile includes a first tile and a second tile adjacent to the first tile, the microLEDs within each of the first tile and the second tile are separated by a substantially uniform distance in substantially orthogonal directions, and the microLEDs at a common edge of the first tile and the second tile are separated by the substantially uniform distance.

Example 22 is a vehicular display, comprising: at least one tile configured to be disposed in a vehicle to provide a display of information, each of the at least one tile including: a transparent flexible substrate; a sparse array of light-emitting diodes (LEDs) disposed on the transparent flexible substrate; a rigid substrate adhered to the transparent flexible substrate via an adhesive layer in which the sparse array of LEDs is encapsulated; and at least one driver disposed on an edge of the tile and configured to drive the LEDs of the sparse array of LEDs.

In Example 23, the subject matter of Example 22 includes, wherein: the rigid substrate is substantially transparent; and the vehicular display further comprises electrical traces configured to electrically power the LEDs of the sparse array of LEDs.

In Example 24, the subject matter of Examples 22-23 includes, wherein the at least one tile is disposed for display of information external to the vehicle.

In Example 25, the subject matter of Example 24 includes, wherein the at least one tile is disposed on or within a front window of the vehicle.

In Example 26, the subject matter of Examples 24-25 includes, wherein the at least one tile is disposed on or within a side window of the vehicle.

In Example 27, the subject matter of Examples 22-26 includes, wherein the at least one tile includes: a first tile configured to display first information external to the vehicle; and a second tile having a second emission surface configured to display second information to an internal compartment of the vehicle.

In Example 28, the subject matter of Example 27 includes, wherein the first tile and the second tile are disposed within a side window of the vehicle.

In Example 29, the subject matter of Examples 27-28 includes, wherein: the first tile has a first emission surface configured to display the first information external to the vehicle; the first tile has an opposing surface opposite the first emission surface; and the second tile is coupled to the opposing surface of the first tile and has a second emission surface configured to display the second information to the internal compartment of the vehicle.

In Example 30, the subject matter of Examples 22-29 includes, wherein: the at least one tile is disposed within a side window of the vehicle in a location corresponding to a view of a side mirror through the side window by an operator of the vehicle, and the at least one tile is configured to provide side window information to replace visual information provided by the side mirror, the side window information being based on images provided by sensors in the vehicle.

In Example 31, the subject matter of Example 30 includes, wherein the sensors include a camera disposed in a location of the side mirror.

In Example 32, the subject matter of Examples 30-31 includes, wherein the sensors include a camera disposed at or near a rear of the vehicle.

In Example 33, the subject matter of Examples 22-32 includes, wherein: the at least one tile is disposed adjacent to a side window of the vehicle, and the at least one tile is configured to provide side window information to replace visual information provided by a side mirror, the side window information being based on images provided by sensors in the vehicle.

In Example 34, the subject matter of Example 33 includes, wherein the sensors include a camera disposed in a location of the side mirror.

In Example 35, the subject matter of Examples 33-34 includes, wherein the sensors include a camera disposed at or near a rear of the vehicle.

In Example 36, the subject matter of Examples 22-35 includes, wherein: the at least one tile is disposed on or within multiple discrete locations of a front window of the vehicle, and the at least one tile is configured to display vehicle information to an internal compartment of the vehicle.

In Example 37, the subject matter of Examples 22-36 includes, wherein: the at least one tile includes a first tile and a second tile adjacent to the first tile, the LEDs within each of the first tile and the second tile are separated by a uniform distance in substantially orthogonal directions, and the LEDs at a common edge of the first tile and the second tile are separated by the uniform distance.

In Example 38, the subject matter of Example 37 includes, wherein the at least one driver includes: a first driver disposed along an edge of the first tile substantially perpendicular to the common edge and configured to drive the first tile, and a second driver configured to drive the second tile, the second driver adjacent to the first driver and disposed along an edge of the second tile substantially perpendicular to the common edge.

In Example 39, the subject matter of Examples 22-38 includes, wherein the at least one tile is disposed on at least one panel of the vehicle.

In Example 40, the subject matter of Examples 22-39 includes, wherein the LEDs are individually-controllable microLEDs.

In Example 41, the subject matter of Examples 22-40 includes, wherein light from the LEDs is emitted substantially parallel to a surface on which the vehicle is disposed.

In Example 42, the subject matter of Examples 22-41 includes, wherein the LEDs comprise optical elements that adjust an angle of emission of the LEDs from a normal angle to an angle such that light from the LEDs is emitted substantially parallel to a surface on which the vehicle is disposed.

In Example 43, the subject matter of Examples 22-42 includes, a sensor and processor configured to detect presence of a viewer and an angle of peak intensity to maximize display of information projected by the at least one tile to the viewer, and at least one of mechanically and optically adjust the angle accordingly.

In Example 44, the subject matter of Example 43 includes, wherein the display of information is configured to be projected external to the vehicle and the viewer outside the vehicle.

In Example 45, the subject matter of Examples 43-44 includes, wherein the display of information is configured to be projected internal to the vehicle and the viewer inside the vehicle.

In Example 46, the subject matter of Examples 22-45 includes, wherein at least one of the at least one tile includes a user input configured to adjust information provided by the at least one of the at least one tile.

In Example 47, the subject matter of Example 46 includes, wherein the user input is configured to adjust information displayed to an interior of the vehicle.

In Example 48, the subject matter of Examples 46-47 includes, wherein the user input is configured to adjust information displayed to an exterior of the vehicle.

In Example 49, the subject matter of Examples 22-48 includes, wherein information provided by the at least one tile is configured to be adjusted by a remote user input on a mobile device.

In Example 50, the subject matter of Example 49 includes, wherein the user input is configured to adjust information displayed to an interior of the vehicle.

In Example 51, the subject matter of Examples 49-50 includes, wherein the user input is configured to adjust information displayed to an exterior of the vehicle.

In Example 52, the subject matter of Examples 22-51 includes, wherein the at least one tile further comprises a blocking layer disposed between the sparse array of LEDs and an outer surface of the at least one tile, the blocking layer configured to convey information by controlling different portions of the blocking layer to block light from specific LEDs from being emitted from the outer surface.

In Example 53, the subject matter of Examples 22-52 includes, wherein the at least one tile further comprises a blocking layer disposed between the sparse array of LEDs and an outer surface of the at least one tile, the blocking layer configured to increase contrast of information conveyed by the at least one tile by outlining alphanumeric information projected from the sparse array of LEDs in a dark penumbra.

Example 54 is at least one machine-readable medium including instructions that, when executed by processing circuitry, cause the processing circuitry to perform operations to implement of any of Examples 1-53.

Example 55 is an apparatus comprising means to implement of any of Examples 1-53.

Example 56 is a system to implement of any of Examples 1-53.

Example 57 is a method to implement of any of Examples 1-53.

While only certain features of the system and method have been illustrated and described herein, many modifications and changes will occur to those skilled in the art. It is, therefore, to be understood that the appended claims are intended to cover all such modifications and changes. Method operations can be performed substantially simultaneously or in a different order. Further, the term "includes" should be interpreted to mean "includes at least the following components."

What is claimed is:

1. A vehicular display, comprising:
    at least one tile configured to be disposed in a vehicle to provide a display of information, each of the at least one tile including:
        a substantially transparent flexible substrate;
        a sparse array of light-emitting diodes (LEDs) disposed on the substantially transparent flexible substrate;
        a substantially transparent rigid substrate attached to the substantially transparent flexible substrate; and
        at least one driver disposed on an edge of the tile and configured to drive the LEDs of the sparse array of LEDs,
    wherein the at least one tile is configured to be disposed on or within multiple discrete locations of a window of the vehicle, and
    the at least one tile is configured to display vehicle information to an internal compartment of the vehicle.

2. The vehicular display of claim 1, wherein:
    the rigid substrate is adhered to the substantially transparent flexible substrate via an adhesive layer in which the sparse array of LEDs is encapsulated; and
    the vehicular display further includes electrical traces configured to electrically power the LEDs of the sparse array of LEDs.

3. The vehicular display of claim 1, wherein the at least one tile includes:
    a first tile configured to display first information in a first direction; and
    a second tile having a second emission surface configured to display second information in a second direction opposite the first direction.

4. The vehicular display of claim 1, wherein:
    the vehicle lacks a side window mirror,
    the vehicle further comprises a sensor configured to obtain information corresponding to visual information that would have been provided by the side window mirror, and the at least one tile is configured to display, based on the information, an image corresponding to the visual information.

5. The vehicular display of claim 1, wherein:
the at least one tile includes a first tile and a second tile adjacent to the first tile;
the LEDs within each of the first tile and the second tile are separated by a substantially uniform distance in substantially orthogonal directions; and
the LEDs at a common edge of the first tile and the second tile are separated by the substantially uniform distance.

6. The vehicular display of claim 5, wherein the at least one driver includes:
a first driver disposed along an edge of the first tile substantially perpendicular to the common edge and configured to drive the first tile, and
a second driver configured to drive the second tile, the second driver adjacent to the first driver and disposed along an edge of the second tile substantially perpendicular to the common edge.

7. The vehicular display of claim 1, wherein the LEDs comprise optical elements that adjust an angle of emission of the LEDs from a substantially normal angle to a predetermined non-normal angle.

8. The vehicular display of claim 1, further comprising a sensor and processor configured to detect presence of a viewer and an angle of peak intensity to increase a display of information projected by the at least one tile to the viewer, and at least one of mechanically and optically adjust the angle accordingly.

9. The vehicular display of claim 1, wherein at least one of the at least one tile includes a user input configured to adjust information provided by the at least one of the at least one tile.

10. The vehicular display of claim 1, wherein information provided by the at least one tile is configured to be adjusted by a remote user input on a mobile device.

11. The vehicular display of claim 1, wherein the at least one tile further comprises a blocking layer disposed between the sparse array of LEDs and an outer surface of the at least one tile, the blocking layer configured to convey information by controlling different portions of the blocking layer to block light from specific LEDs from being emitted from the outer surface.

12. The vehicular display of claim 1, wherein the at least one tile further comprises a blocking layer disposed between the sparse array of LEDs and an outer surface of the at least one tile, the blocking layer configured to increase contrast of information conveyed by the at least one tile by outlining alphanumeric information projected from the sparse array of LEDs in a dark penumbra.

13. A vehicular display, comprising:
at least one tile configured to be disposed in a vehicle to provide a display of information, each of the at least one tile including:
a substantially transparent flexible substrate;
a sparse array of individually-controllable micro light-emitting diodes (microLEDs) disposed on the substantially transparent flexible substrate; and
a substantially transparent rigid substrate attached to the substantially transparent flexible substrate; and
a sensor and processor configured to detect presence of a viewer and an angle of peak intensity to increase a display of information projected by the at least one tile to the viewer, and at least one of mechanically and optically adjust the angle accordingly.

14. The vehicular display of claim 13, wherein the at least one tile includes:
a first tile configured to display first information in a first direction; and
a second tile having a second emission surface configured to display second information in a second direction opposite the first direction.

15. The vehicular display of claim 13, further comprising a sensor configured to provide images corresponding to information provided by a side window mirror, wherein the at least one tile is configured to replace visual information provided by the side window mirror with the images.

16. The vehicular display of claim 13, wherein:
the at least one tile includes a first tile and a second tile adjacent to the first tile;
the microLEDs within each of the first tile and the second tile are separated by a substantially uniform distance in substantially orthogonal directions; and
the microLEDs at a common edge of the first tile and the second tile are separated by the substantially uniform distance.

17. The vehicular display of claim 13, wherein at least one of:
the at least one tile includes a user input configured to adjust information provided by the at least one tile, and
the information provided by the at least one tile is configured to be adjusted by a remote user input on a mobile device.

18. A vehicular display, comprising:
at least one tile configured to be disposed in a vehicle to provide a display of information, each of the at least one tile including:
a substantially transparent flexible substrate;
a sparse array of individually-controllable micro light-emitting diodes (microLEDs) disposed on the substantially transparent flexible substrate;
a substantially transparent rigid substrate attached to the substantially transparent flexible substrate; and
at least one driver disposed on an edge of the tile and configured to drive the microLEDs of the sparse array of microLEDs, and
at least one of the at least one tile includes a user input configured to adjust information provided by the at least one tile or the information provided by the at least one tile is configured to be adjusted by a remote user input on a mobile device.

19. The vehicular display of claim 18, wherein:
the at least one tile includes a first tile and a second tile adjacent to the first tile;
the microLEDs within each of the first tile and the second tile are separated by a substantially uniform distance in substantially orthogonal directions; and
the microLEDs at a common edge of the first tile and the second tile are separated by the substantially uniform distance.

* * * * *